US010024691B2

(12) United States Patent
Kusumi et al.

(10) Patent No.: US 10,024,691 B2
(45) Date of Patent: Jul. 17, 2018

(54) POSITION DETECTING DEVICE

(71) Applicant: DMG MORI SEIKI CO., LTD., Yamato-Koriyama, Nara (JP)

(72) Inventors: Masaaki Kusumi, Isehara (JP); Yusuke Takei, Isehara (JP); Shigeru Ishimoto, Isehara (JP); Mitsugu Yoshihiro, Isehara (JP)

(73) Assignee: DMG MORI SEIKI CO., LTD., Yamato-Koriyama (JP)

( * ) Notice: Subject to any disclaimer, the term of this patent is extended or adjusted under 35 U.S.C. 154(b) by 0 days.

(21) Appl. No.: 15/599,777

(22) Filed: May 19, 2017

(65) Prior Publication Data
US 2017/0307409 A1    Oct. 26, 2017

Related U.S. Application Data

(62) Division of application No. 14/640,752, filed on Mar. 6, 2015, now Pat. No. 9,733,317.

(30) Foreign Application Priority Data

Mar. 10, 2014  (JP) ................................. 2014-046232
Mar. 28, 2014  (JP) ................................. 2014-068956
(Continued)

(51) Int. Cl.
*G01B 7/00*      (2006.01)
*G01R 33/025*    (2006.01)
(Continued)

(52) U.S. Cl.
CPC ............... *G01D 5/16* (2013.01); *G01D 5/244* (2013.01); *G01D 5/2451* (2013.01);
(Continued)

(58) Field of Classification Search
CPC ................ G01R 33/096; G01R 33/098; G01D 5/24438; G01D 5/2451; G01D 5/2452; G01D 5/244; G01D 5/16
(Continued)

(56) References Cited

U.S. PATENT DOCUMENTS 4,616,281 A  * 10/1986  Nakamura ............. G01B 7/023
                                                    324/207.21
4,810,965 A  *  3/1989  Fujiwara .................. G01D 5/20
                                                    324/207.21
(Continued)

FOREIGN PATENT DOCUMENTS

CN       104913792 A    9/2015
EP         2918978 A1   9/2015
(Continued)

OTHER PUBLICATIONS

Aug. 15, 2015 Extended Search Report issued in European Patent Application No. 15158138.6.
(Continued)

*Primary Examiner* — Jermele M Hollington
*Assistant Examiner* — Sean Curtis
(74) *Attorney, Agent, or Firm* — Oliff PLC

(57) ABSTRACT

A magnetism detecting element detects a leakage magnetism from a scale, on which a magnetic signal with a constant period is recorded, and a relative position between the scale and the magnetism detecting element is detected. The magnetism detecting elements are arranged, along a detection direction of the magnetic signal relative to the scale, in a pattern with a pitch of ½n (n is a prime number of 3 or more) of a wavelength $\lambda'$ of a signal output by the element. Furthermore, as the pattern for cancelling m odd-order harmonics, the m-th power of 2 magnetism detecting elements are arranged within a range in which a pitch distance (Continued)

L of the magnetism detecting element farthest in the detection direction is expressed by $L=(\lambda'/2)\times(1/3+1/5+1/7+\ldots 1/(2m+1))$.

4 Claims, 20 Drawing Sheets

(30) Foreign Application Priority Data

| Mar. 28, 2014 | (JP) | ................. | 2014-068957 |
| Mar. 28, 2014 | (JP) | ................. | 2014-068958 |

(51) Int. Cl.
- *G01D 5/16* (2006.01)
- *G01R 33/09* (2006.01)
- *G01D 5/244* (2006.01)
- *G01D 5/245* (2006.01)

(52) U.S. Cl.
CPC ....... *G01D 5/2452* (2013.01); *G01D 5/24438* (2013.01); *G01R 33/096* (2013.01); *G01R 33/098* (2013.01)

(58) Field of Classification Search
USPC ..... 324/207.11–207.13, 207.21, 207.24, 213
See application file for complete search history.

(56) References Cited

U.S. PATENT DOCUMENTS

| 4,818,939 | A | * | 4/1989 | Takahashi | ............... | G01D 5/145 |
| | | | | | | 324/173 |
| 5,216,363 | A | * | 6/1993 | Masaaki | ............... | G01B 7/003 |
| | | | | | | 324/207.21 |
| 5,243,280 | A | * | 9/1993 | Kusumi | ............... | G01B 7/003 |
| | | | | | | 324/207.21 |
| 5,587,846 | A | * | 12/1996 | Miyano | ............... | G01D 5/145 |
| | | | | | | 250/201.2 |
| 5,790,341 | A | | 8/1998 | Cunningham et al. | | |
| 5,909,115 | A | * | 6/1999 | Kano | ............... | B82Y 10/00 |
| | | | | | | 324/207.12 |
| 5,943,639 | A | | 8/1999 | Tanaka et al. | | |
| 6,070,132 | A | * | 5/2000 | Ishimoto | ............... | G01B 7/02 |
| | | | | | | 702/158 |
| 6,118,271 | A | * | 9/2000 | Ely | ............... | H01F 13/003 |
| | | | | | | 324/207.17 |
| 6,222,361 | B1 | * | 4/2001 | Shimano | ............... | G01R 33/09 |
| | | | | | | 324/207.21 |
| 6,236,200 | B1 | * | 5/2001 | Nekado | ............... | G01V 3/105 |
| | | | | | | 324/174 |
| 6,470,292 | B1 | * | 10/2002 | Tanaka | ............... | G01D 5/2457 |
| | | | | | | 700/186 |
| 6,490,807 | B1 | * | 12/2002 | Tanaka | ............... | G01B 7/003 |
| | | | | | | 33/708 |
| 6,531,866 | B2 | * | 3/2003 | Miyata | ............... | G01D 5/2086 |
| | | | | | | 324/207.12 |
| 6,545,262 | B1 | * | 4/2003 | Burgschat | ............... | G01D 5/2451 |
| | | | | | | 250/231.13 |
| 6,566,862 | B1 | * | 5/2003 | Goto | ............... | G01D 3/0365 |
| | | | | | | 324/207.16 |
| 6,693,565 | B2 | * | 2/2004 | Kusumi | ............... | G01D 5/24409 |
| | | | | | | 341/11 |
| 6,768,426 | B2 | * | 7/2004 | Nekado | ............... | G01D 5/2495 |
| | | | | | | 341/11 |
| 6,771,445 | B1 | | 8/2004 | Hamann et al. | | |
| 6,772,101 | B1 | * | 8/2004 | Tanaka | ............... | G01D 5/24409 |
| | | | | | | 324/207.11 |
| 6,788,053 | B2 | * | 9/2004 | Nekado | ............... | G01D 5/2033 |
| | | | | | | 324/244 |
| 7,071,681 | B1 | * | 7/2006 | Shiraki | ............... | G01D 5/24485 |
| | | | | | | 324/207.21 |
| 7,378,839 | B2 | * | 5/2008 | Abe | ............... | G01D 5/145 |
| | | | | | | 324/207.21 |
| 7,965,074 | B2 | * | 6/2011 | Nakagawa | ............... | G01D 5/145 |
| | | | | | | 324/207.21 |
| 8,208,231 | B2 | | 6/2012 | Nishimura et al. | | |
| 8,629,572 | B1 | | 1/2014 | Phillips | | |
| 9,234,738 | B2 | | 1/2016 | Asano et al. | | |
| 9,250,301 | B2 | * | 2/2016 | Okada | ............... | G01D 5/2451 |
| 9,322,677 | B2 | | 4/2016 | Kusumi et al. | | |
| 9,396,366 | B2 | | 7/2016 | Ogomi et al. | | |
| 9,541,423 | B2 | * | 1/2017 | Kogej | ............... | G01D 5/24409 |
| 9,719,805 | B2 | * | 8/2017 | Kusumi | ............... | G01D 5/16 |
| 9,733,316 | B2 | | 8/2017 | Lei et al. | | |
| 2002/0008510 | A1 | * | 1/2002 | Miyata | ............... | G01D 5/2086 |
| | | | | | | 324/207.17 |
| 2002/0190710 | A1 | * | 12/2002 | Steinich | ............... | G01D 5/24404 |
| | | | | | | 324/207.24 |
| 2003/0006765 | A1 | * | 1/2003 | Nekado | ............... | G01D 5/2033 |
| | | | | | | 324/258 |
| 2003/0187608 | A1 | * | 10/2003 | Nekado | ............... | G01D 5/2492 |
| | | | | | | 702/150 |
| 2003/0187609 | A1 | * | 10/2003 | Kusumi | ............... | G01D 5/24409 |
| | | | | | | 702/150 |
| 2004/0046679 | A1 | * | 3/2004 | Nekado | ............... | G01D 5/2495 |
| | | | | | | 341/7 |
| 2004/0157067 | A1 | | 8/2004 | Kusumi et al. | | |
| 2006/0208726 | A1 | * | 9/2006 | Mock | ............... | G01D 5/145 |
| | | | | | | 324/207.24 |
| 2007/0126417 | A1 | * | 6/2007 | Nihei | ............... | G01D 5/145 |
| | | | | | | 324/207.21 |
| 2009/0115409 | A1 | * | 5/2009 | Arinaga | ............... | G01D 5/145 |
| | | | | | | 324/207.25 |
| 2009/0116151 | A1 | * | 5/2009 | Nakagawa | ............... | G01D 5/145 |
| | | | | | | 360/313 |
| 2010/0052664 | A1 | * | 3/2010 | Nishizawa | ............... | G01D 5/2451 |
| | | | | | | 324/207.25 |
| 2010/0055501 | A1 | | 3/2010 | Nishimura et al. | | |
| 2011/0218760 | A1 | * | 9/2011 | Takahama | ............... | G01P 3/64 |
| | | | | | | 702/150 |
| 2011/0291646 | A1 | | 12/2011 | Musha et al. | | |
| 2012/0025812 | A1 | * | 2/2012 | Dolsak | ............... | G01D 5/24438 |
| | | | | | | 324/207.25 |
| 2012/0038351 | A1 | * | 2/2012 | Saruki | ............... | G01R 33/091 |
| | | | | | | 324/207.25 |
| 2012/0038359 | A1 | * | 2/2012 | Saruki | ............... | B82Y 25/00 |
| | | | | | | 324/252 |
| 2013/0200885 | A1 | | 8/2013 | Asano et al. | | |
| 2014/0049252 | A1 | * | 2/2014 | Taniguchi | ............... | G01D 5/2455 |
| | | | | | | 324/207.21 |
| 2014/0097833 | A1 | * | 4/2014 | Kusumi | ............... | G01D 9/10 |
| | | | | | | 324/207.25 |
| 2014/0103914 | A1 | * | 4/2014 | Kusumi | ............... | G01D 5/38 |
| | | | | | | 324/207.21 |
| 2014/0152299 | A1 | * | 6/2014 | Okada | ............... | G01D 5/2451 |
| | | | | | | 324/207.21 |
| 2014/0247042 | A1 | | 9/2014 | Lei et al. | | |
| 2014/0354270 | A1 | * | 12/2014 | Kawano | ............... | G01B 7/003 |
| | | | | | | 324/207.21 |
| 2015/0253162 | A1 | * | 9/2015 | Kusumi | ............... | G01R 33/098 |
| | | | | | | 324/207.12 |
| 2015/0354987 | A1 | * | 12/2015 | Kusumi | ............... | G01D 5/145 |
| | | | | | | 324/207.21 |
| 2017/0284830 | A1 | | 10/2017 | Kusumi et al. | | |
| 2017/0307409 | A1 | * | 10/2017 | Kusumi | ............... | G01D 5/16 |

FOREIGN PATENT DOCUMENTS

| JP | 2529960 B2 | 9/1996 |
| JP | 2008-151759 A | 7/2008 |
| JP | 2009-25047 A | 2/2009 |
| JP | 2009036637 A | 2/2009 |
| JP | 2012-073241 A | 4/2012 |
| WO | 2008130002 A1 | 10/2008 |
| WO | 2010/100407 A1 | 9/2010 |
| WO | 2011136054 A1 | 11/2011 |
| WO | 2012/066667 A1 | 5/2012 |
| WO | 2013024830 A1 | 2/2013 |

(56) References Cited

FOREIGN PATENT DOCUMENTS

| WO | 2013/029510 A1 | 3/2013 | |
|---|---|---|---|
| WO | WO 2013132207 A1 * | 9/2013 | ......... G01D 5/24409 |
| WO | 2013/161027 A1 | 10/2013 | |
| WO | 2015087725 A1 | 6/2015 | |
| WO | 2015087726 A1 | 6/2015 | |

OTHER PUBLICATIONS

Dec. 1, 2016 Office Action Issued in U.S. Appl. No. 14/640,752.
Aug. 17, 2017 Office Action Issued in U.S. Appl. No. 15/600,058.
Jan. 30, 2018 Office Action Issued in U.S. Appl. No. 15/600,058.

* cited by examiner

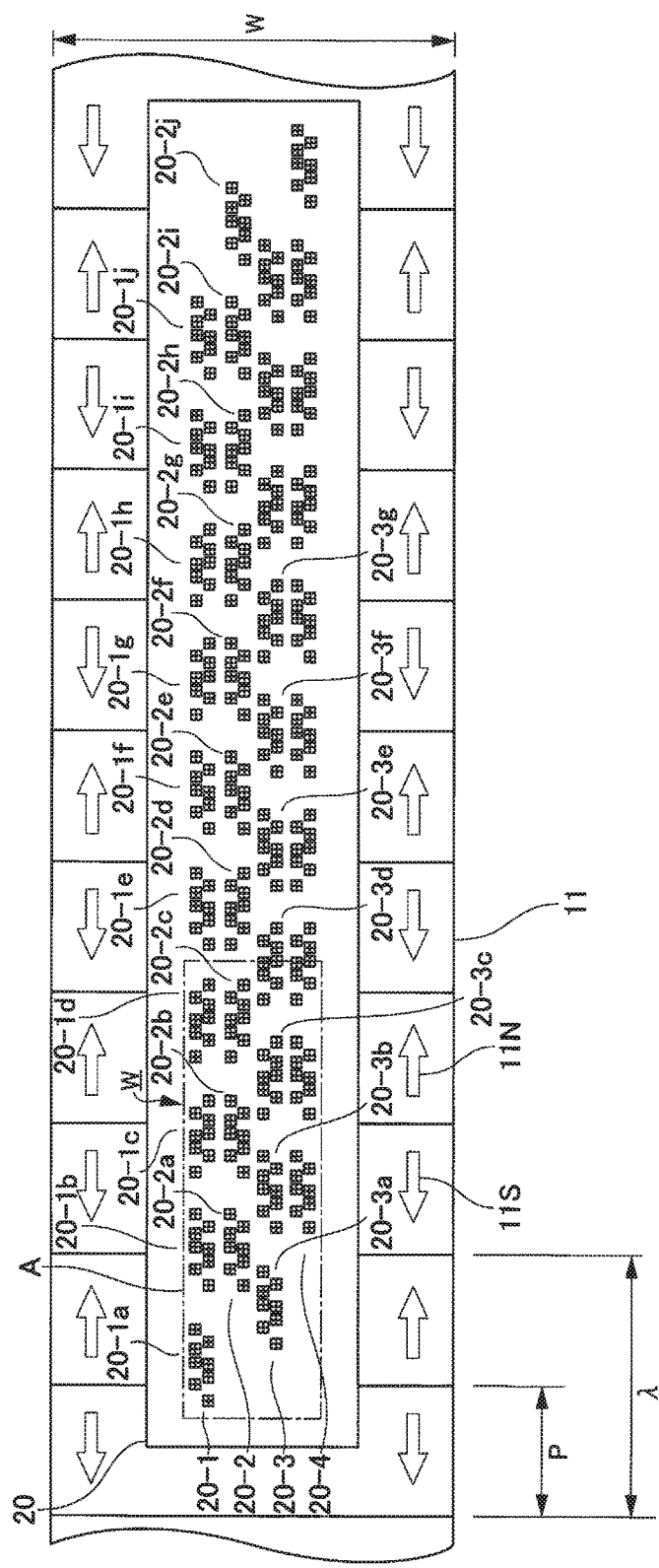

(a) SIN(x)

(b) COS(x)

(c) TAN(x) =SIN(x)/COS(x)

(d) POSITIONAL INFORMATION x

POSITION DETECTING DEVICE

CROSS REFERENCES TO RELATED APPLICATIONS

This is a Division of application Ser. No. 14/640,752 filed Mar. 6, 2015, which claims priority to Japanese Patent Applications JP 2014-046232, filed in the Japanese Patent Office on Mar. 10, 2014, Japanese Patent Applications JP 2014-068956, filed in the Japanese Patent Office on Mar. 28, 2014, Japanese Patent Applications JP 2014-068957, filed in the Japanese Patent Office on Mar. 28, 2014, and Japanese Patent Applications JP 2014-068958, filed in the Japanese Patent Office on Mar. 28, 2014, respectively. The disclosures of the prior applications are hereby incorporated by reference herein in their entirety.

BACKGROUND OF THE INVENTION

Field of the Invention

The present invention relates to position detecting devices that detect the relative position between a head and a scale, such as a magnetic scale or an optical scale.

Description of the Related Art

Conventionally, as the position detecting device that detects precise displacement position, such as linear displacement or rotational displacement, there is known a position detecting device including a magnetic scale and a magnetism detecting element. The position detecting device is widely utilized, for example, in the electronic-component mounting apparatuses that need accurate positioning control of a conveyed article, the detection (measurement) devices that detect (measure) the dimensions of a component, and the like.

FIG. 1 illustrates the fundamental configuration of a conventional magnetic-type position detecting device. The position detecting device in FIG. 1 detects linear displacement, and includes a magnetic scale 1 including a magnetic medium. In the magnetic scale 1, the magnetization directions of the S pole and N pole are reversed for each constant distance. One unit, in which the S pole and N pole are repeated, is one wavelength of the recording signal of the magnetic scale 1.

Then, in the position detecting device of FIG. 1, a magnetic head 5 is prepared that moves along the longitudinal direction (x direction in the view), in which the magnetization direction of the magnetic scale 1 is reversed, and two magnetic sensors 5a and 5b are arranged in the magnetic head 5. The respective magnetic sensors 5a and 5b are the sensors that detect the magnetism leaking into a space from the magnetization recorded in the near magnetic scale 1, and are arranged spaced apart from each other by the distance corresponding to ¼ period of one wavelength (1×λ) of a reproduced signal. Therefore, one magnetic sensor 5a detects the recording signal of the magnetic scale 1 as a sinusoidal signal (SIN signal), while the other magnetic sensor 5b detects the recording signal of the magnetic scale 1 as a cosine signal (COS signal).

Here, the relative position between the magnetic scale 1 and the magnetic head 5 is represented by x. The relative position x is calculated from the SIN signal sin(x) output by the magnetic sensor 5a and the COS signal cos(x) output by the magnetic sensor 5b. Note that sin(x)/cos(x) is calculated using the SIN signal and COS signal to obtain tan(x), and then from the value of the tan(x), the relative position x between the magnetic scale 1 and the magnetic head 5 within one wavelength is obtained (interpolation), so that the position x is calculated with a resolution finer than the length of one wavelength. The information about the calculated position is transmitted to a positional information display device and control apparatus.

FIG. 2 illustrates an arrangement example of the magnetic scale and magnetism detecting elements of a conventional magnetic-type position detecting device. The example of FIG. 2 illustrates a case of detecting linear displacement, and includes the magnetic scale 1 including a magnetic medium. In the magnetic scale 1, the magnetization directions of the S pole and N pole are reversed for each constant distance. One unit, in which the S pole and N pole are repeated, is one wavelength of the recording signal of the magnetic scale 1.

Then, the position detecting device includes a detecting section 2 having magnetism detecting elements 3a to 3h arranged at positions near the magnetic scale 1. As the magnetism detecting elements 3a to 3h, AMR (Anisotropic Magneto-Resistance) elements are used which utilize the anisotropy resistance effect, for example. In the magnetism detecting device, the magnetic scale 1 is arranged on the fixed side and the detecting section 2 is arranged on the movable side, so that the position detecting device detects the relative position between the magnetic scale 1 and the detecting section 2.

FIG. 3 illustrates an arrangement example of eight magnetism detecting elements 3a to 3h. The upper side of FIG. 3 is an element arrangement seen from the top face of the magnetic scale 1, while the lower side of FIG. 3 is an element arrangement seen in a cross sectional direction of the magnetic scale 1.

The magnetic scale 1 is magnetized into the N pole and S pole at a predetermined interval in the longitudinal direction. Then, as the magnetic signal detected by the magnetism detecting element, one period during which the N pole and S pole alternately change is one wavelength λ. A half of one wavelength λ is one pitch P. The N pole and S pole are linearly arranged at one pitch interval.

Then, close to the magnetic scale 1, four magnetism detecting elements 3a to 3d are arranged close to each other. As the arrangement interval of these four magnetism detecting elements 3a to 3d, as illustrated in FIG. 3, two magnetism detecting elements 3a and 3b are arranged at the interval of one pitch P, and the other two magnetism detecting elements 3c and 3d are arranged at the interval of one pitch P. Then, the magnetism detecting elements 3a and 3c are spaced apart from each other by (n+½)p. Here, n is an integer. These four magnetism detecting elements 3a to 3d are connected in series. A series circuit having these four magnetism detecting elements 3a to 3d connected in series is connected between a portion at a predetermined potential V and a ground potential portion GND, and a signal Ch+ is extracted from the middle point (i.e., connection point between the magnetism detecting elements 3b and 3c) of the series circuit.

Furthermore, other four magnetism detecting elements 3e to 3h are arranged spaced apart by a predetermined distance (m+½)P from these four magnetism detecting elements 3a to 3d. Here, m is an integer. The arrangement interval of these four magnetism detecting elements 3e to 3h is the same as that of the magnetism detecting elements 3a to 3d, and these four magnetism detecting elements 3e to 3h are connected in series. A series circuit having these four magnetism detecting elements 3e to 3h connected in series is connected between the portion at the predetermined potential V and the ground potential portion GND, and a signal Ch− is extracted from the middle point (i.e., connection point between the magnetism detecting elements 3*f* and 3*g*) of the series circuit.

Note that the magnetism detecting elements 3*a* to 3*h* each have a P/6-step portion roughly at the center thereof. The P/6-step portion is for removing the 3rd order distortion from the detection signal.

FIG. 4 illustrates a connection configuration for obtaining a detection signal from these eight magnetism detecting elements 3*a* to 3*h*.

The signal Ch+ obtained from the middle point of four magnetism detecting elements 3*a* to 3*d* and the signal Ch− obtained from the middle point of four magnetism detecting elements 3*e* to 3*h* are supplied to an operational amplifier 4. In the operational amplifier 4, both the signals Ch+ and Ch− are differentially amplified and extracted as the detection signal.

By extracting the signal detected by the magnetism detecting elements 3*a* to 3*h* with the configurations illustrated in FIG. 3 and FIG. 4, a detection signal whose distortion has been cancelled is obtained. That is, because among the four magnetism detecting elements 3*a* to 3*d*, the elements 3*a* and 3*b* and the elements 3*c* and 3*d* are arranged at the interval of ¼ of one wavelength of the recording signal, the signal changes detected by the respective sets of the elements 3*a* and 3*b* and of the elements 3*c* and 3*d* have opposite phases. Then, these four magnetism detecting elements 3*a* to 3*d* are connected in series and the signal Ch+ is extracted from the middle point of the series circuit, so that the even order distortions of the detection signal are canceled.

Another set of four magnetism detecting elements 3*e* to 3*h* are similarly connected and the signal Ch− is extracted, so that the even order distortions of the detection signal are canceled.

Furthermore, these signals Ch+ and Ch− are supplied to the operational amplifier 4 so that a detection signal amplified by the operational amplifier 4 is obtained.

The configurations illustrated in FIG. 3 and FIG. 4 are for obtaining one detection signal, and therefore in obtaining a plurality of signals from the magnetic scale 1, the same number of the detecting sections 2 illustrated in FIG. 3 as the number of the detection signals are arranged. For example, when the recording signal of the magnetic scale 1 needs to be detected as the sinusoidal signal (SIN signal) and the cosine signal (COS signal), two sets of the detecting sections 2 illustrated in FIG. 3 are needed. When the −SIN signal and the −COS signal are obtained, further two sets of the detecting sections 2 are needed. Patent Literature 1 describes an example of the magnetic-type position detecting device.

CITATION LIST

Patent Literature

PATENT LITERATURE 1 Japanese Laid-open Patent Publication No. 2009-36637

SUMMARY OF THE INVENTION

An AMR element conventionally used as the magnetism detecting element of the position detecting device has a problem that the resistance change rate with respect to a change in the magnetic field is small. Moreover, in arranging the magnetism detecting element at a position near a magnetic scale, a positional relationship is usually employed, which brings a higher sensitivity so that the resistance value of the magnetism detecting element varies with an extremely small magnetic field.

Here, the AMR element has a characteristic that the resistance value thereof sharply varies under lower magnetic fields and saturates under a strong magnetic field. FIG. 5 illustrates a change rate (vertical axis) of the resistance value with respect to the magnetic field (horizontal axis) of the AMR element. In FIG. 5, the change rate from the resistance value at the magnetic field of 0 to the resistance value at the magnetic field of 250 is set to 100 and indicated as the normalized vertical axis. As the actual change in the resistance value, the resistance change of approximately 3% corresponds to the value of 100.

As illustrated in FIG. 5, the change rate is saturated in the area with a particularly strong magnetic field. In the saturated area, the curve indicative of the change rate of the resistance value with respect to the magnetic field is distorted and accordingly the detected signal will also have a distortion. Also, in the unsaturated area, the detected signal is usually caused to have a distortion, which is not such large as the distortion in the saturated area, depending on the shape of the change rate curve.

Such distortion of the detection signal results in degradation of the position detection accuracy, which is not preferable. Because the position detecting device detects an accurate relative position by interpolation of the detected waveforms obtained by the detecting section, distortion of the signal waveform detected by the magnetism detecting element needs to be avoided as much as possible. However, the conventional distortion removal arrangement has a problem that the distortion is not sufficiently removed.

The respective magnetism detecting elements for cancelling the respective-order distortions need to be arranged. Therefore, a large number of magnetism detecting elements need to be arranged in order to remove higher-order harmonic distortions. However, the size of one magnetism detecting element including the AMR element and the like is relatively large, and therefore a large number of installation spaces will be needed, resulting in the problem that the detecting section having the magnetism detecting elements arranged therein will increase in size.

In the case of the example of FIG. 3, the respective magnetism detecting elements 3*a* to 3*h* each have step-portions shifted from each other by P/6 pitch in order to cancel the 3rd order harmonic. In the case of canceling the 3rd order harmonic, such level of configuration works well, but in the case of canceling the 3rd-and-higher order harmonics, a problem arises that the shift amount thereof becomes finer and thus the elements for canceling the respective harmonics will overlap. Therefore, the respective elements need to be arranged spaced apart from each other by one or more pitches, and the detecting section having the magnetism detecting elements arranged therein will significantly increase in size, as a result.

When the respective elements for canceling the harmonics are arranged spaced apart from each other by one pitch or more, as described above, the respective elements are arranged at positions away from a reference position by a predetermined distance, for example such as an integral multiple of one pitch+p/6 pitch so that the signal with a target phase is detected. However, signals detected from the elements arranged at such separate places are not the signals detected from the elements at the same position and therefore the distortion thereof cannot be perfectly cancelled.

For example, if the magnetization states of the respective magnetized portions of the magnetic scale are equal, even with two signals detected from the places spaced apart by one pitch or more the distortions thereof can be properly cancelled. However, the magnetization states (the magnetism uniformity, surface shape, and the like of the medium) on the magnetic scale are generally not perfectly equal due to various factors and thus the leakage magnetisms from the magnetic scale become non-uniform. Therefore, there has been a problem that the effect of cancelling the harmonic distortions will decrease.

Note that, the problem is true also in the width direction orthogonal to the longitudinal direction of the magnetic scale, and thus the arrangement of a plurality of magnetism detecting elements being shifted from each other in the width direction of the magnetic scale is not preferable because the cancel effect will decrease.

Accordingly, a pair of magnetism detecting elements that cancel the higher-order harmonic distortions are preferably arranged within the same wavelength distance and at the same track position. However, in the case of the conventionally used element, such as the above-described AMR element, it has been difficult to arrange a pair of the elements at the same track position within the same wavelength distance because the size of one element is large.

Moreover, as the signal detected by the position detecting device, two signals: the SIN signal and COS signal, whose phases are shifted from each other by at least 90° need to be detected. Here, in the case of the detecting section 2 using the conventional AMR element, it is difficult to detect the SIN signal and COS signal at the same time with one detecting section because the size of the AMR element is relatively large as compared with the magnetic scale. That is, a detecting section that detects the SIN signal and a detecting section that detects the COS signal are arranged at the positions shifted from each other by a predetermined wavelength in the longitudinal direction of the magnetic scale. Accordingly, the states (the levels, phases, and the like) of two signals having phases shifted from each other will not be perfectly equal, thus posing a problem in accuracy.

In recent years, a tunnel magnetic junction element (hereinafter, referred to as a "TMR element") using the tunnel magneto-resistance effect (TMR effect) has been developed. The utilization of the TMR element has been increasing in the field of magnetic recording, such as in a hard disk. For example, in the hard disk drive using the TMR element, the recording density has been significantly increased as compared with the conventional hard disk drive.

Also in the position detecting device using the magnetic scale, an improvement in position detection accuracy can be expected by applying the TMR element to the magnetic head.

In detecting the relative position between a magnetic scale and a magnetic head, the distortion and/or error of the signal detected by the magnetic head are preferably reduced as much as possible. That is, in the case of the position detecting device using a magnetic scale, the signal detected by the magnetic head has a sinusoidal waveform or a cosine waveform. Because the position detecting device detects an accurate relative position by interpolation of these detected waveforms, distortion of the signal waveform detected by the magnetic head needs to be avoided as much as possible.

The TMR element has a distortion characteristic different from that of the detection element conventionally used for a position detecting device, and therefore a new distortion removal approach is required in applying the TMR element to the position detecting device. For example, the TMR element has an effect that the change rate of resistance due to a magnetic field is large. However, unless the linearity of the change characteristic of the resistance value due to the magnetic field applied to the TMR element is secured, there is a problem that the accurate magnetic field from the magnetic scale cannot be detected.

An object of the present invention is to provide a position detecting device capable of eliminating the influences of distortions and the like and performing accurate position detection.

A position detecting device according to a first aspect of the present invention includes: a scale having a magnetic signal with a constant period magnetically recorded on a magnetic medium; a magnetism detecting element configured to detect a leakage magnetism from the scale and output a signal corresponding to a recording signal at a position where the leakage magnetism is detected; and a position detecting section configured to detect a position relative to the scale based on the signal corresponding to the recording signal.

The magnetism detecting elements are arranged, along a detection direction of a magnetic signal relative to the scale, in a pattern with the pitch of $\lambda'/2n$ (n is a prime number of 3 or more) of a wavelength $\lambda'$ of the signal output by the magnetism detecting element.

Furthermore, as the pattern for cancelling m odd-order harmonics, the m-th power of 2 magnetism detecting elements are arranged within a range in which a pitch distance L of the magnetism detecting element farthest in the detection direction is expressed by $L=(\lambda'/2)\times(1/3+1/5+1/7+ \ldots 1/(2m+1))$ (m is an integer), so that the odd-order harmonic signals are reduced from the signal corresponding to the recording signal.

A position detecting device according to a second aspect of the present invention includes: a scale having a magnetic signal with a constant period magnetically recorded on a magnetic medium; a magnetism detecting element configured to detect a leakage magnetism from the scale and output a signal corresponding to a recording signal at a position where the leakage magnetism is detected; and a position detecting section configured to detect a position relative to the scale based on the signal corresponding to the recording signal.

The magnetism detecting elements are formed into a pattern, from which at least one set of signals each having a different phase are output, along a detection direction of the magnetic signal relative to the scale, and are arranged in a direction orthogonal to the detection direction and also within a range shorter than one unit wavelength of the magnetic signal.

In this case, a total of two sets of signals, i.e., one set of signals each having a different phase and one set of signals whose phases are opposite to the phases of the former set of signals, may be output, so that the detecting sections of the outputs having opposite phases may be arranged next to each other in a direction orthogonal to the detection direction.

Furthermore, in a detecting section from which at least one set of signals each having a different phase are output or in a total of four detecting sections that detect the two sets of signals, the arrangement structures of the respective sets of detection elements are the same. Further, in the arrangement of the respective sets of detection elements in the longitudinal direction, the amount of shift in the longitudinal direction with the respective different phase-differences may be set to a minimum phase difference at a distance smaller than one unit wavelength of the magnetic signal.

A position detecting device according to a third aspect of the present invention includes: a scale having a magnetic signal with a constant period magnetically recorded on a magnetic medium; a magnetism detecting element configured to detect a signal corresponding to the signal recorded in the scale; a bias magnetic field generation section configured to apply a bias magnetic field to the magnetism detecting element; and a position detecting section configured to detect a position relative to the scale based on a signal corresponding to a recording signal detected by the magnetism detecting element.

Here, the magnetism detecting element includes an element that includes a first and a second magnetic layer and a barrier layer sandwiched therebetween. The magnetization direction of the first magnetic layer is a direction that is fixed in parallel or anti-parallel with a direction along which position detection is performed. The second magnetic layer varies its magnetization direction in accordance with the quantity of a magnetic field in a direction in parallel or anti-parallel with the direction along which position detection is performed, of the leakage magnetisms from the scale, thereby outputting a signal corresponding to the position where the leakage magnetism is detected.

The bias magnetic field generation section applies a bias magnetic field to the second magnetic layer of the magnetism detecting element, thereby setting the magnetization direction of the second magnetic layer to a direction different from the magnetization direction of the first magnetic layer in a state where there is no leakage magnetism from the scale.

According to the first aspect of the present invention, a detection signal with reduced odd-order harmonics can be obtained because the magnetism detecting elements are formed into a pattern that allows the odd-order harmonics to be canceled when the magnetism detecting elements detect a leakage magnetism from the scale. Accordingly, the position detecting device according to the first aspect of the present invention has an effect that accurate position detection can be performed from the detection signal with reduced distortions.

According to the second aspect of the present invention, a plurality of pattern groups, from which signals each having a different phase are output, are arranged side by side within a range shorter than one unit wavelength of the magnetic signal and in a direction orthogonal to the direction along which the signals are detected, so that a detection signal having each phase can be detected from the recording signal within the same unit wavelength on the scale. Therefore, the second aspect of the present invention has an effect that the variation between the levels or the like of the signals of the respective phases can be suppressed as much as possible and thus the accuracy in detecting the position from a plurality of signals each having a different phase will improve.

According to the third aspect of the present invention, because an appropriate bias magnetic field is being applied when the magnetism detecting element detects a leakage magnetism from the scale, the magnetism detecting element can be made the one having excellent conversion efficiency and/or conversion linearity of a signal recorded in the scale, thus allowing for accurate position detection, as a result.

BRIEF DESCRIPTION OF THE DRAWINGS

FIG. 11 is a configuration diagram illustrating an example of the element arrangement of a position detecting device according to a second embodiment of the present invention.

DESCRIPTION OF THE PREFERRED EMBODIMENTS

1. Example of First Embodiment

Hereinafter, an example of a first embodiment of the present invention is described with reference to FIG. 6 to FIG. 10.

Note that the configuration described in the first embodiment may be combined with the configuration or configurations described in other embodiments (e.g., third embodiment and/or fourth embodiment) described herein.

1-1. Configuration Example of Position Detecting Device

Figure 6:
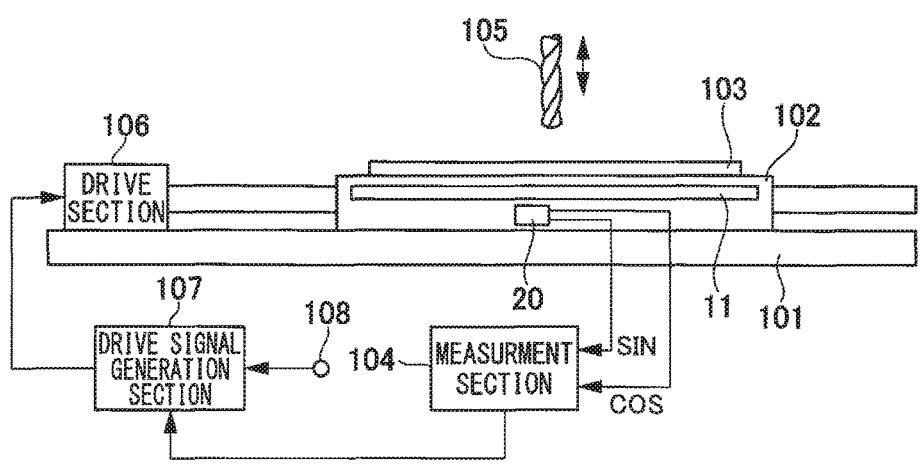
FIG. 6 is a configuration diagram illustrating an example of the whole configuration of a mechanism including a position detecting device according to a first embodiment of the present invention.

FIG. 6 illustrates an example of the whole configuration of a driving mechanism including a position detecting device of the example when incorporated therein.

A position detecting device 100 illustrated in FIG. 6 is an example applied to a machining tool. That is, the position detecting device 100 detects a moving distance of a movable stage 102 moveably arranged on a stationary section 101 in a machining tool.

A work piece 103 is secured to the movable stage 102, and is machined by a machining tool 105. The position of the movable stage 102 varies with the drive by a drive section 106.

A magnetic scale 11 is arranged in the movable stage 102. The magnetic scale 11 is configured to attach a magnetic medium having signals recorded thereon, the signal having magnetized the magnetic medium alternately to the N pole and S pole for each constant distance, to the surface of the metal plate. The magnetic scale 11 is formed in a length equal to or greater than the maximum moving distance detected by the position detecting device 100.

A detecting section 20 is arranged on the stationary section 101 side and is close to the magnetic scale 11. Then, a detection element (a magnetism detecting element 21 illustrated in FIG. 7) inside the detecting section 20 detects the signal recorded in the magnetic scale 11. Here, the detecting section 20 includes a plurality of magnetism detecting elements, wherein the magnetism detecting elements detect the recording signal of the magnetic scale 11 as a sinusoidal signal (SIN signal) and a cosine signal (COS signal), respectively. Moreover, magnetism detecting elements that detect a −SIN signal and −COS signal that are the inversion signals of the SIN signal and COS signal are also arranged in the detecting section 20.

These SIN signal, −SIN signal, COS signal, and −COS signal detected by the detecting section 20 are supplied to a position detecting section 104, and the relative position between the magnetic scale 11 and the detecting section 20 is calculated from these signals by arithmetic processing of the position detecting section 104. The positional information calculated by the position detecting section 104 is supplied to a control section 107. The control section 107 calculates a difference between target-position information input from a target-position input section 108 and the positional information supplied from the position detecting section 104 to generate a drive signal for moving the movable stage 102 by the difference. Then, the drive signal generated by the control section 107 is supplied to a drive section 106. The drive section 106 moves the movable stage 102 by a moving amount indicated by the supplied drive signal.

1-2. Arrangement Example of Magnetism Detecting Elements

Figure 7:
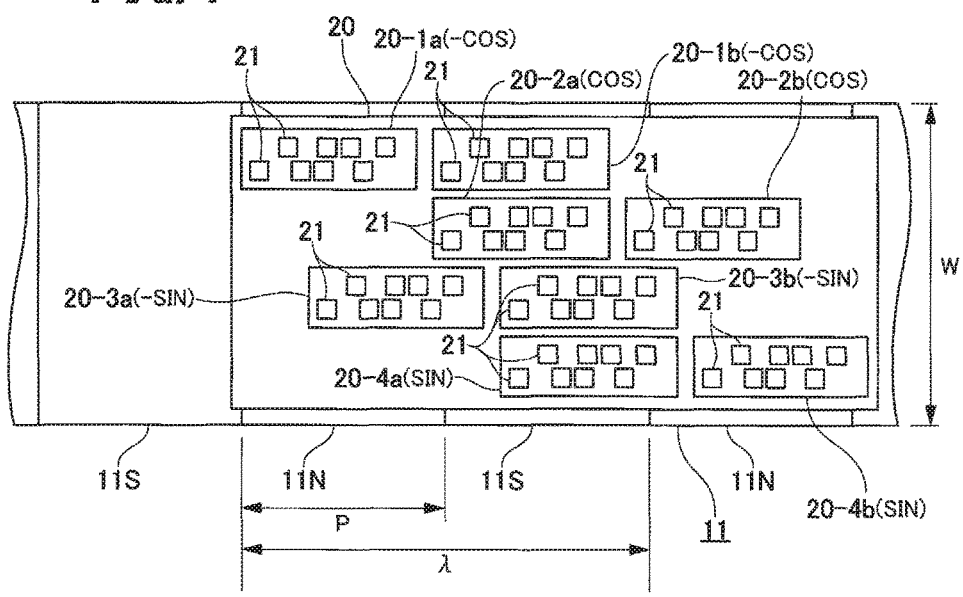
FIG. 7 is a configuration diagram illustrating an example of the element arrangement of the position detecting device according to the first embodiment of the present invention.

FIG. 7 illustrates an example of the arrangement of the detecting sections 20 relative to the magnetic scale 11.

In the magnetic scale 11, an N pole magnetization section 11N and an S pole magnetization section 11S are continuously arranged at a predetermined interval. As illustrated in FIG. 7, one period during which the N pole and S pole change corresponds to one wavelength λ. A half of one wavelength λ corresponds to one pitch P. Here, one wavelength λ is set to 400 μm.

In the detecting section 20, a plurality of magnetism detecting elements 21 each including a TMR element (tunnel magnetism junction element) is compactly arranged. The TMR element utilizes the tunnel magneto-resistance effect (TMR effect). The TMR element has an advantage that a change in the resistance value relative to a change in the magnetic field is large. Therefore, in the case where the TMR element is applied to the magnetism detecting element 21 that detects a magnetic field leaking from the magnetic scale 11, the size of the individual magnetism detecting element 21 can be significantly reduced.

In the example of FIG. 7, four detecting sections 20-1 to 20-4 are arranged adjacent to each other in the width W direction of the magnetic scale 11 that is the direction orthogonal to the longitudinal direction of the magnetic scale 11. In arranging these four detecting sections 20-1 to 20-4 in the width W direction of the magnetic scale 11, these are arranged at an interval as short as possible within a range shorter than one unit wavelength.

The detecting sections 20-1a, 20-1b are −COS detecting sections serving as the pattern group of the elements that detect the −COS signal. The detecting sections 20-2a, 20-2b are COS detecting sections serving as the pattern group of the elements that detect the COS signal. The detecting sections 20-3a, 20-3b are −SIN detecting sections serving as the pattern group of the elements that detect the −SIN signal. The detecting sections 20-4a, 20-4b are SIN detecting sections serving as the pattern group of the elements that detect the SIN signal. In order to detect these −SIN signal, SIN signal, −COS signal, and COS signal, the respective detecting sections 20-1a, 20-1b to 20-4a, 20-4b are arranged at positions each being shifted by λ/4 sequentially in the longitudinal direction of the magnetic scale 11. Specifically, the −COS detecting sections 20-1a, 20-1b and COS detecting sections 20-2a, 20-2b are arranged at the interval of one pitch P, and the −SIN detecting sections 20-3a, 20-3b and SIN detecting sections 20-4a, 20-4b are also arranged at the interval of one pitch P. The −COS detecting section 20-1 and −SIN detecting section 20-3 are arranged at the intervals of a half of one pitch P (i.e., λ/4).

Two detecting sections (e.g., detecting section 20-1a and detecting section 20-1b) among the detecting sections 20-1 to 20-4 each indicated with codes a, b attached are electrically connected in series, and an output signal is extracted from the connection point between two detecting sections (e.g., detecting sections 20-1a, 20-1b) connected in series. In this manner, the detecting sections constitute the so-called bridge.

In the respective detecting sections 20-1a, 20-1b to 20-4a, 20-4b, within the range of one unit wavelength of the magnetic signal, a plurality of magnetism detecting elements 21 is compactly arranged in a predetermined pattern. In the following description, these detecting sections 20-1a, 20-1b to 20-4a, 20-4b each may be referred to as a compact arrangement section. Here, a plurality of magnetism detecting elements 21 inside each of the detecting sections 20-1a, 20-1b to 20-4a, 20-4b is arranged at the positions where the odd-order harmonic distortions can be cancelled.

That is, the respective magnetism detecting elements 21 are arranged in the pattern of a pitch of ½n (n is a prime number of 3 or more) of the signal wavelength λ' along the longitudinal direction of the magnetic scale 11. The signal wavelength λ' is the wavelength of the output signal of the magnetism detecting element 21. When the magnetism detecting element 21 is the TMR element described herein, [the wavelength λ of the magnetic signal] is equal to [the wavelength λ' of the output signal], but depending on the configuration of the magnetism detecting elements 21 [the wavelength λ of the magnetic signal] may be [two times the wavelength λ' of the output signal] (AMR element or the like). The following describes, as an example, a case where the magnetism detecting element 21 is the TMR element and [the wavelength λ of the magnetic signal]]=[the wavelength λ' of the output signal]. Note that, as described later in FIG. 15 and the like, when the direction of a fixed layer of the element is the same as the longitudinal direction of the scale, the formula [the wavelength λ of the magnetic signal]]=[the wavelength λ' of the output signal] is satisfied by using the TMR element. Even in the case of using the TMR element, depending on the direction of the fixed layer of the element, [the wavelength λ of the magnetic signal]] may differ from [the wavelength λ' of the output signal].

Then, in order to cancel m odd-order harmonics (m is an integer), m-th power of 2 magnetism detecting elements 21 are arranged in a range in which the distance L of the magnetism detecting element 21 farthest in the longitudinal direction of the magnetic scale 11 is expressed by L=(λ'/2)×(⅓+⅕+⅐+ . . . 1/(2m+1)).

Specifically, for example, when the configuration of the detecting sections 20-1a, 20-1b to 20-4a, 20-4b is intended to cancel the 3rd, 5th, and 7th order harmonic distortions, eight (=2³) magnetism detecting elements 21 are arranged in the respective detecting sections 20-1a, 20-1b to 20-4a, 20-4b in a range of L=(λ'/2)×(⅓+⅕+⅐).

In the example of FIG. 7, in the detecting sections 20-1a, 20-1b to 20-4a, 20-4b that are the respective compact arrangement sections, four magnetism detecting elements 21 are arranged in the longitudinal direction of the magnetic scale 11, and these four magnetism detecting elements 21 are arranged in two rows in the width direction of the magnetic scale 11. A specific example of the arrangement interval of the elements 21 required for cancelling the 3rd, 5th, and 7th order harmonic distortions will be described in the example of a second embodiment and therefore the description thereof is omitted here.

1-3. Configuration of Magnetism Detecting Element

Figure 8:
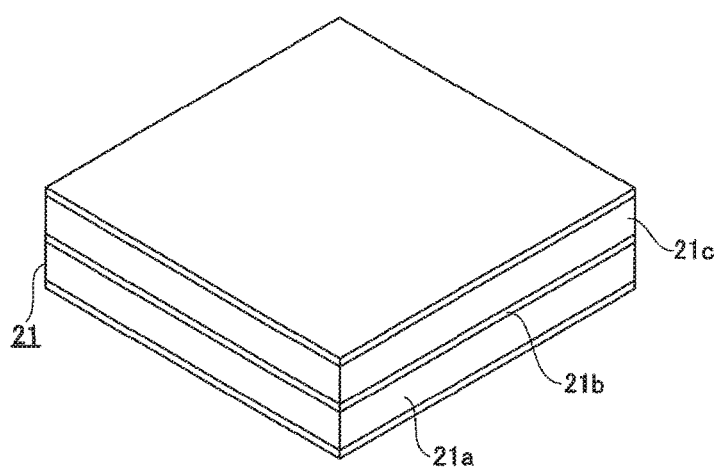
FIG. 8 is a perspective view illustrating a configuration example of a magnetism detecting element according to the first embodiment of the present invention.

Next, referring to FIG. 8, the configuration of the magnetism detecting element 21 included in the detecting section 20 is described.

FIG. 8 illustrates a configuration example of the magnetism detecting element 21 that is the TMR element.

As illustrated in FIG. 8, the magnetism detecting element 21 includes three layers, i.e., a fixed layer 21a, a barrier layer 21b, and a free layer 21c. Note that, in addition to these layers, the magnetism detecting element 21 further includes various types of layers, such as a wiring layer for leading out a signal and a protection layer, but the illustration thereof is omitted here.

The fixed layer 21a is a layer whose magnetization direction is fixed. A magnetization direction H1 of the fixed layer 21a is the same as the direction of the magnetic field leaking from the N pole magnetization section of the magnetic scale 11, for example.

The free layer 21c is a layer whose magnetization direction varies with the magnetism leaking from the magnetic scale 11. These fixed layer 21a and free layer 21c are magnetic layers, while the barrier layer 21b is an insulating layer. In the magnetism detecting element 21, when the magnetization directions of the fixed layer 21a and the free layer 21c are the same, the whole resistance value of the element 21 decreases, while when the magnetization direction of the fixed layer 21a and the free layer 21c are opposite to each other, the whole resistance value of the element 21 increases. In this manner, the resistance value of the magnetism detecting element 21 significantly varies with a change in the magnetization direction. Furthermore, in the case of the TMR element, the length of one side of one magnetism detecting element 21 can be made very small, as small as approximately 2 μm to 10 μm.

Figure 9A:
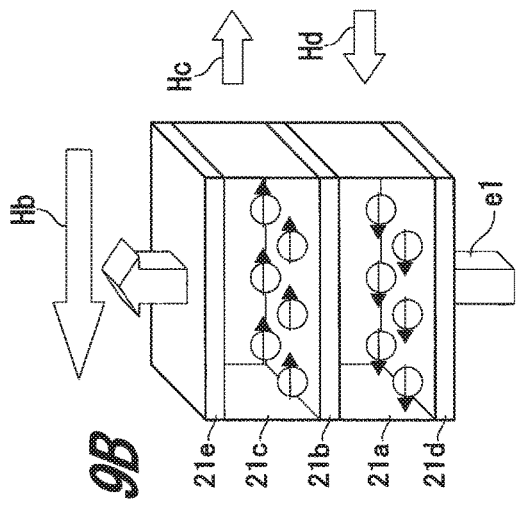
FIGS. 9A-9C is an explanatory view illustrating an example of the change of the resistance value of the magnetism detecting element according to the first embodiment of the present invention.
Figure 9B:
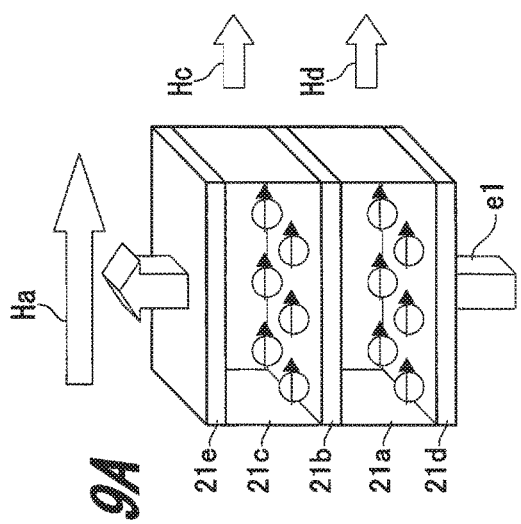
Figure 9C:
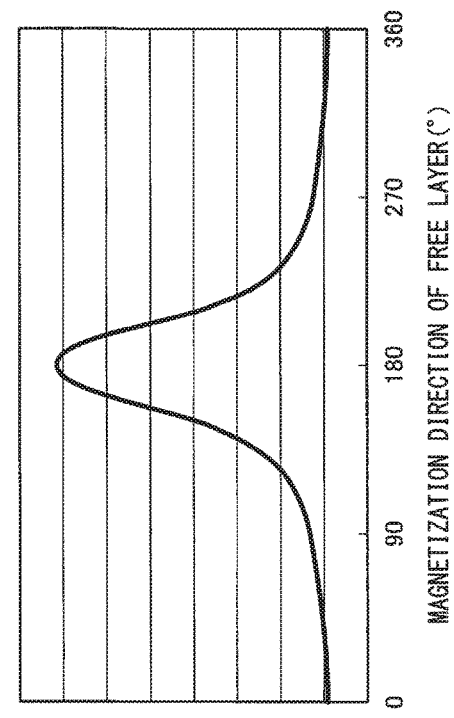

FIGS. 9A to 9C illustrate a relationship between the magnetization direction of each layer inside the magnetism detecting element 21 and the resistance value.

FIG. 9A illustrates a case where the magnetization direction of the fixed layer 21a and the magnetization direction of the free layer 21c are the same (e.g., when a magnetic field Ha from the N pole magnetization section 11N is detected), while FIG. 9B illustrates a case where the magnetization direction of the fixed layer 21a and the magnetization direction of the free layer 21c are opposite to each other (e.g., when a magnetic field Hb from the S pole magnetization section 11S is detected). Reference numeral el in FIG. 9A and FIG. 9B indicates the flow of electric current. The direction of electric current may be opposite to the illustrated direction.

The graph illustrated in FIG. 9C illustrates a change of the resistance value caused by a change of the magnetization direction of the free layer 21c. The case where the magnetization direction of the free layer 21c is 0° corresponds to the state illustrated in FIG. 9A, while the case where the magnetization direction of the free layer 21c is 180° corresponds to the state illustrated in FIG. 9B.

As apparent from FIG. 9C, when the magnetization direction of the free layer 21c is 0°, the resistance value of the magnetism detecting element 21 becomes the minimum, while when the magnetization direction of the free layer 21c is 180°, the resistance value of the magnetism detecting element 21 becomes the maximum. Then, as apparent from the curve of the characteristic illustrated in FIG. 9C, when the magnetization direction of the free layer 21c is an angle between 0 and 180°, a resistance value corresponding to the angle can be obtained.

1-4. Connection State of Magnetism Detecting Elements

Figure 10A:
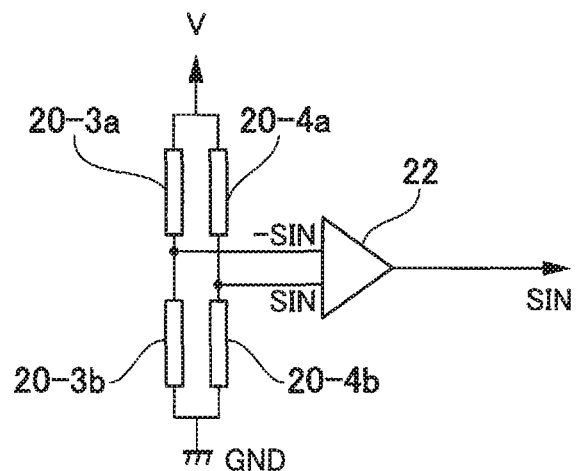
FIGS. 10A-10B is a configuration diagram illustrating an example of the connection of the magnetism detecting elements according to the first embodiment of the present invention.
Figure 10B:
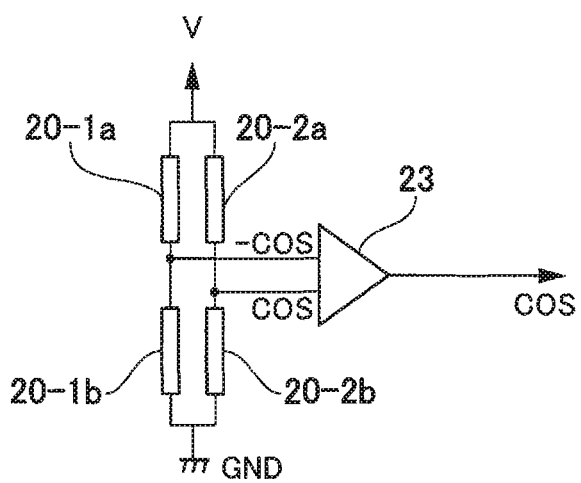

FIGS. 10A and 10B illustrate an example of the connection of the magnetism detecting elements 21 inside four detecting sections 20-1 to 20-4 in the detecting section 20.

FIG. 10A illustrates the configuration for obtaining the SIN signal. The magnetism detecting elements 21 inside the −SIN detecting section 20-3 for detecting the −SIN signal are connected in series between a portion from which the predetermined voltage V is obtained and the ground potential portion GND, and the −SIN signal is extracted from the middle point of the series circuit.

Moreover, the magnetism detecting elements 21 inside the SIN detecting section 20-4 for detecting the SIN signal are also connected in series between the portion from which the predetermined voltage V is obtained and the ground potential portion GND, and the SIN signal is extracted from the middle point of the series circuit.

The −SIN signal and SIN signal extracted from the series circuit of the magnetism detecting elements 21 are supplied to an operational amplifier 22, and then the SIN signal is obtained as the output signal of the operational amplifier 22. The SIN signal output by the operational amplifier 22 is supplied to the position detecting section 104 (FIG. 6).

FIG. 10B illustrates the configuration for obtaining the COS signal. The magnetism detecting elements 21 inside the −COS detecting section 20-1 for detecting the −COS signal are also connected in series between the portion from which the predetermined voltage V is obtained and the ground potential portion GND, and the −COS signal is extracted from the middle point of the series circuit.

Moreover, the magnetism detecting elements 21 inside the COS detecting section 20-2 for detecting the COS signal are also connected in series between the portion from which the predetermined voltage V is obtained and the ground potential portion GND, and the COS signal is extracted from the middle point of the series circuit.

The −COS signal and COS signal extracted from the series circuit of the magnetism detecting elements 21 are supplied to an operational amplifier 23, and then the COS signal is obtained as the output signal of the operational amplifier 23. The COS signal output by the operational amplifier 23 is supplied to the position detecting section 104.

Note that, in any one of the connection configuration of FIG. 10A and the connection configuration of FIG. 10B, a signal detected by the element connected to the voltage V side of the middle point of the respective series circuits and a signal detected by the element connected to the ground potential portion GND side of the middle point are adapted to vary so as to have the phases opposite to each other. In this manner, by connecting the magnetism detecting elements 21 so that the signals vary so as to have the phases opposite to each other, even-order distortions of the signals obtained by the operational amplifiers 22 and 23 are cancelled.

Furthermore, as the arrangement of the respective magnetism detecting elements 21, m-th power of 2 magnetism detecting elements 21 are arranged in a range in which the distance L of the magnetism detecting element 21 farthest in the longitudinal direction is expressed by $L=(\lambda'/2)\times(1/3+1/5+1/7+\ldots 1/(2m+1))$, so that the odd-order harmonics are also favorably canceled.

In particular, as illustrated in FIG. 7, the magnetism detecting elements 21 are compactly arranged by 4×2 rows inside the respective detecting sections 20-1 to 20-4, so that the respective magnetism detecting elements 21 will detect the magnetism leaking from substantially the same portion of the magnetic scale 11. Therefore, for example, even when the recording states of the respective signal recording portions of the magnetic scale 11 are not uniform, a sufficient cancel effect will be obtained.

The SIN signal and COS signal with both the even-order and odd-order harmonic distortions canceled are obtained in this manner, so that the position detecting section 104 can perform accurate position detection by interpolation from these SIN signal and the COS signal.

The SIN signal and COS signal are the signals with a predetermined signal period $\lambda$ and with the phases shifted to each other by 90°. The Lissajous curve produced by these SIN signal and COS signal becomes a circle. Once one period of signal is output, the circle will rotate one round on the Lissajous curve.

Here, a signal at a certain position corresponds to a certain point on the Lissajous circle and an angle between a straight line connecting the certain point and the origin and the axis serving as the reference is determined. Then, the angle is a unique angle within $\lambda$ at the certain point of the signal. In the position detecting section 104 illustrated in FIG. 6, by performing calculation for finely determining the angle, the position of the detecting section 20 on the magnetic scale 11 can be determined with a finer resolution.

An angle on the Lissajous circle can be determined from a tangent (TAN) angle obtained from the SIN signal and COS signal and a quadrant in which the SIN signal and COS signal exist. Here, as described above, the SIN signal and COS signal with both the even-order and odd-order harmonic distortions canceled are obtained, so that the calculation can be performed from the signals without distortion to detect accurate position. In addition, because a plurality of magnetism detecting elements 21 that is arranged to cancel the harmonic distortions is compactly arranged as illustrated in FIG. 7, the signals detected from the recording signals at substantially the same position can be cancelled to each other and furthermore accurate distortion removal can be performed. Therefore, the positional accuracy will improve further.

Furthermore, as apparent from the element arrangement of FIG. 7, four detecting sections 20-1, 20-2, 20-3, and 20-4 for detecting the −SIN signal, SIN signal, −COS signal, and COS signal are arranged side by side in the direction orthogonal to the longitudinal direction of the magnetic scale 11, so that the detection signal with each phase is detected from the recording signal within the same unit wavelength on the scale. Therefore, the variation between the levels or the like of the signals with the respective phases can be suppressed as much as possible and thus the detection accuracy will also improve.

2. Example of Second Embodiment

Next, an example of a second embodiment of the present invention is described with reference to FIG. 11 to FIG. 14.

In FIG. 11 to FIG. 14, the same member as that described in the example of the first embodiment is given the same reference numeral to omit the detailed description thereof. The configuration described in the second embodiment may be combined with the configuration or configurations described in other embodiments (e.g., third embodiment and/or fourth embodiment) described herein.

In the example of the second embodiment, the arrangement of the magnetism detecting elements 21 included in the detecting section 20 differs from that in the example of the first embodiment, on the other hand the configuration described in the example of the first embodiment is applied to the configuration of the whole position detecting device of the second embodiment.

2-1. Arrangement Example of Magnetism Detecting Elements

Figure 12:
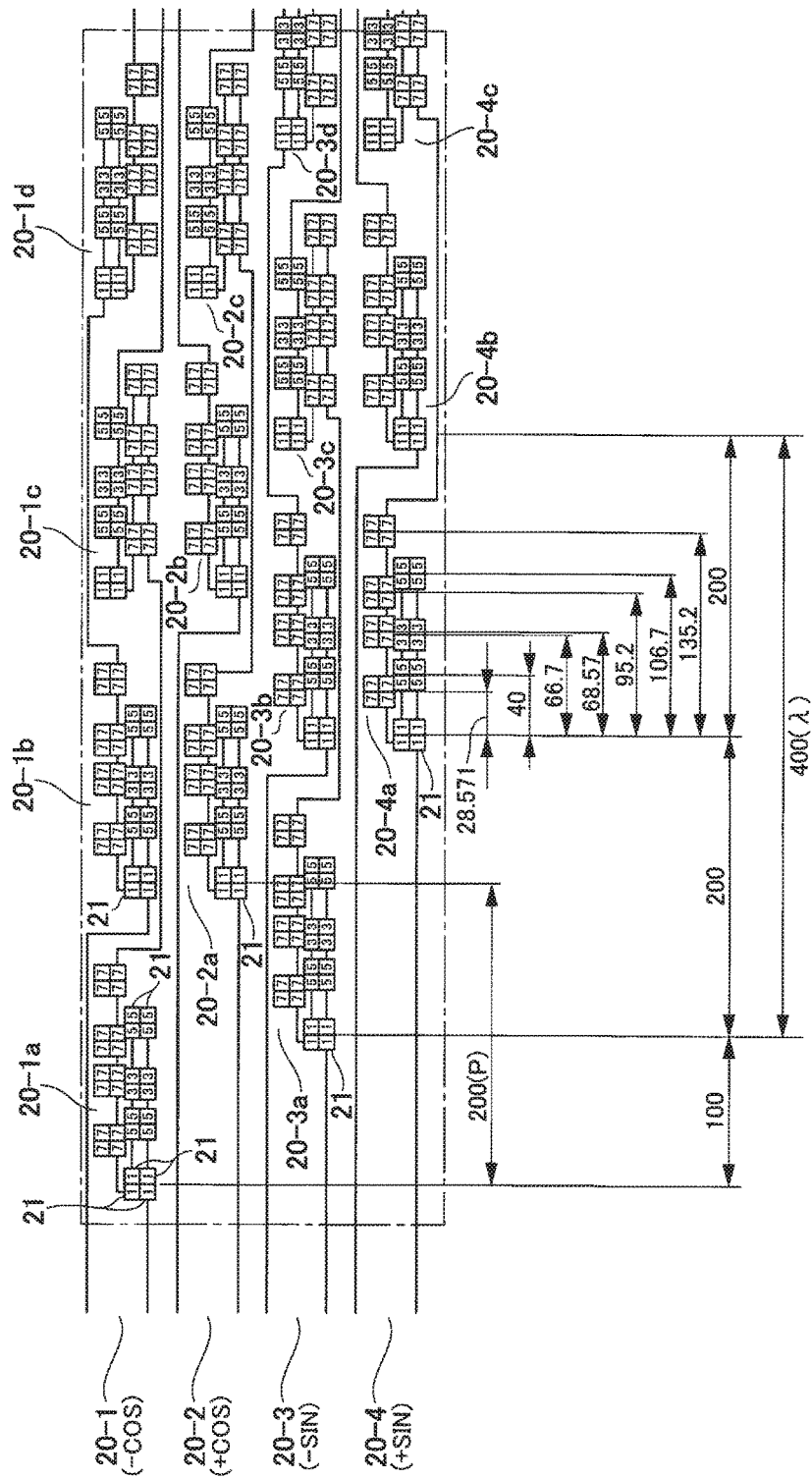
FIG. 12 is an enlarged configuration diagram illustrating a part of FIG. 11.

FIG. 11 illustrates an example of the arrangement of the detecting section 20 relative to the magnetic scale 11. Moreover, FIG. 12 is an enlarged view of a portion A surrounded by the dashed line of FIG. 11.

In the magnetic scale 11, the N pole magnetization section 11N and the S pole magnetization section 11S are continuously arranged at a constant interval. In the example, one wavelength λ is 400 μm and one pitch P is 200 μm.

The magnetism detecting element 21 included in the detecting section 20 is the TMR element. The configuration of the magnetism detecting element 21 including the TMR element is the same as that described in FIG. 8, for example.

In the detecting section 20, four detecting sections 20-1 to 20-4 are arranged adjacent to each other in the width W direction of the magnetic scale 11. That is, the detecting section 20 includes the −COS detecting section 20-1 that detects the −COS signal, the COS detecting section 20-2 that detects the COS signal, the −SIN detecting section 20-3 that detects the −SIN signal, and the SIN detecting section 20-4 that detects the SIN signal. These detecting sections 20-1 to 20-4 are each shifted by 90° (¼λ).

Then, each of the detecting sections 20-1 to 20-4 includes ten compact arrangement sections arranged continuously in the longitudinal direction of the magnetic scale 11.

Specifically, the −COS detecting section 20-1 includes ten compact arrangement sections 20-1a to 20-1j, the COS detecting section 20-2 includes ten compact arrangement sections 20-2a to 20-2j, the −SIN detecting section 20-3 includes ten compact arrangement sections 20-3a to 20-3j, and the SIN detecting section 20-4 includes ten compact arrangement sections 20-4a to 20-4j.

Inside the respective compact arrangement sections 20-1a to 20-1j, 20-2a to 20-2j, 20-3a to 20-3j, and 20-4a to 20-4j, a plurality of magnetism detecting elements 21 is arranged within the range of one unit wavelength of the magnetic signal. Here, in each compact arrangement section, 32 magnetism detecting elements 21 each having the size of approximately 5 μm by 5 μm are arranged. These 32 elements are arranged so that the respective four elements, i.e., two elements in the width direction and two elements in the track direction, i.e., 2×2 elements, constitute one set of elements, and eight magnetism detecting elements 21 are arranged in the respective compact arrangement sections. When one element is referred to in the description of FIG. 12, one set of these four elements are referred to.

A plurality of arranged magnetism detecting elements 21 is the elements for detecting a target signal and also for canceling the odd-order harmonics of the target signal. Here, eight magnetism detecting elements 21 arranged in one compact arrangement section will cancel three harmonics, i.e., the 3rd, 5th, and 7th order harmonics.

That is, in order to cancel m odd-order harmonics (here, m is 3), m-th power of 2 ($2^3$=eight) magnetism detecting elements 21 will be arranged within the range in which the distance L of the magnetism detecting element 21 farthest in the longitudinal direction of the magnetic scale 11 is expressed by L=(λ'/2)×(⅓+⅕+⅐). The wavelength λ' is the wavelength of the output signal of the magnetism detecting element 21, where when the magnetism detecting element 21 is the TMR element described herein, [the wavelength λ of the magnetic signal] matches [the wavelength λ' of the output signal].

A number inside a block of the magnetism detecting element 21 illustrated in each of the detecting sections 20-1 to 20-4 illustrated in FIG. 12 represents the order of a harmonic cancelled by the relevant magnetism detecting element 21, for ease of understanding of the following description. The magnetism detecting element 21 described as "1" detects the signal (1st order signal) serving as the reference. The magnetism detecting elements 21 inside each compact arrangement section are connected in series as indicated by lines connecting these elements 21 in FIG. 12. However, the connection line inside the set of four elements is omitted.

Here, with respect to the arrangement of the magnetism detecting elements 21 inside one compact arrangement section, a specific configuration for cancelling the harmonics up to the 7th order harmonic is described. In FIG. 12, the detail of the arrangement intervals between eight magnetism detecting elements 21 inside the compact arrangement section 20-4a is illustrated, but other compact arrangement sections also have the same arrangement intervals. However, in some of the compact arrangement sections, the rows are reversed.

First, the intervals between the magnetism detecting elements 21 needed to cancel the odd-order (from the 3rd order to 7th order) harmonic distortions when one wavelength λ of the magnetic scale 11 is 400 μm are given below.

The 3rd order: 66.6 μm
The 5th order: 40 μm
The 7th order: 28.57 μm

Here, 66.6 μm for the 3rd order is λ/6, 40 μm for the 5th order is λ/10, and 28.57 μm for the 7th order is λ/14.

Inside the compact arrangement section, eight (=$2^3$) magnetism detecting elements 21 are arranged at these intervals. When the size of one magnetism detecting element 21 is approximately 10 μm×10 μm, all the elements cannot be arranged on the same track position, and therefore here the elements are arranged in two rows. The same track here indicates that the positions in the width direction on the magnetic scale 11 are the same.

In arranging the magnetism detecting elements 21 inside the compact arrangement section, the magnetism detecting elements 21 for the low-order (3rd and 5th order) distortion reduction are preferentially arranged on the same track, first. That is, at the position shifted by 66.6 μm from the magnetism detecting element (element described as "1") serving as the reference, the magnetism detecting elements 21 (elements described as "3") for the 3rd order distortion reduction are arranged. Moreover, the magnetism detecting elements 21 (elements described as "5") for the 5th order distortion reduction are arranged at each of the position shifted by 40 μm from the magnetism detecting element 21 serving as the reference and the position shifted by 40 μm from the magnetism detecting element 21 for the 3rd order distortion reduction.

Next, on another track adjacent to the track on which these four elements 21 are arranged, the magnetism detecting elements (elements described as "7") for the 7th order distortion reduction are arranged. These magnetism detecting elements 21 for the 7th order distortion reduction are arranged at the positions shifted by 28.57 μm respectively from the four magnetism detecting elements 21 for the 1st order, 3rd order, and 5th order on the adjacent track.

In this manner, the magnetism detecting elements 21 for the 3rd, 5th, and 7th order harmonic reduction are arranged inside one compact arrangement section.

Note that, in the example of FIG. 12, an example is illustrated in which the magnetism detecting elements 21 for the 3rd order distortion reduction and the magnetism detecting elements 21 for the 5th order distortion reduction can be arranged on the same track, but when all these elements cannot be arranged on the same track, it is preferable that the elements for the lower-order (3rd order) distortion reduction are preferentially arranged on the same track.

2-2. Example of Connection in Compact Arrangement Section

Figure 13:
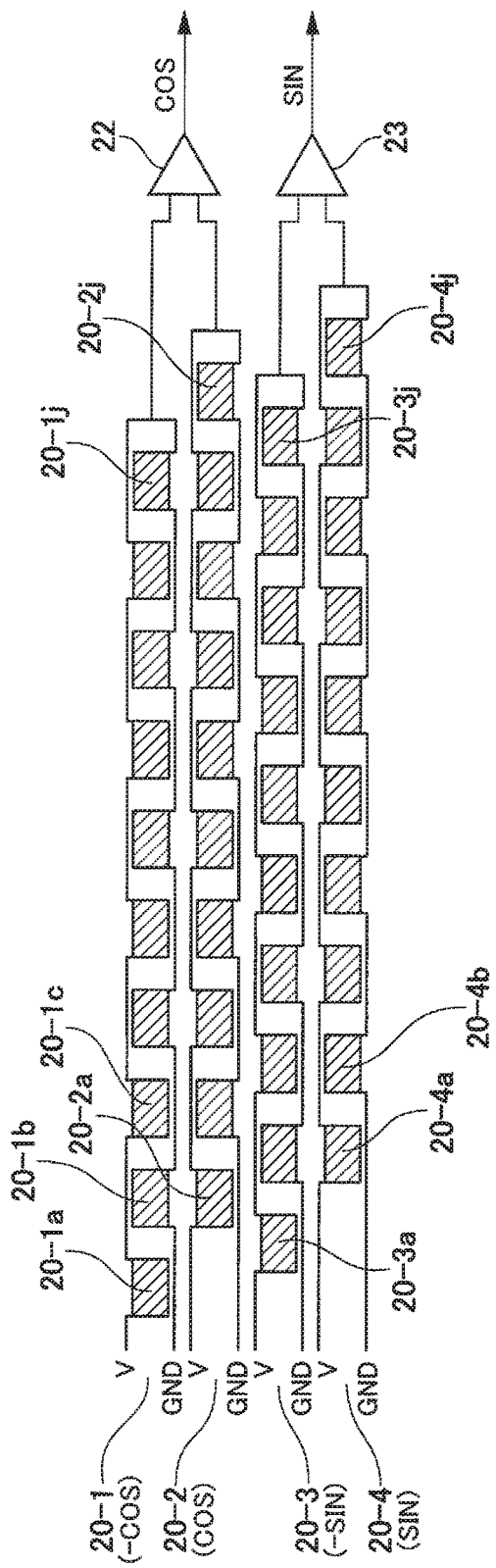
FIG. 13 is a configuration diagram illustrating an example of the connection of magnetism detecting elements according to the second embodiment of the present invention.

FIG. 13 illustrates an example of the connection of ten compact arrangement sections included in the respective detecting sections 20-1 to 20-4 illustrated in FIG. 11.

In the −COS detecting section 20-1, ten compact arrangement sections 20-1a to 20-1j are arranged at the interval of one pitch P (200 μm) in the longitudinal direction of the magnetic scale 11. Here, as illustrated in FIG. 13, the magnetism detecting elements 21 of each compact arrangement section are alternately connected in series.

That is, five compact arrangement sections 20-1a, 20-1c, . . . , 20-1i are connected in series, and the predetermined voltage V is applied to the series circuit. Moreover, other five compact arrangement sections 20-1b, 20-1d, . . . , 20-1j are connected in series, and the series circuit is connected to the ground potential portion GND.

Then, in the −COS detecting section 20-1 as illustrated in FIG. 13, the series circuit of five compact arrangement sections 20-1a to 20-1i on the side to which the predetermined voltage V is applied and the series circuit of five compact arrangement sections 20-1b to 20-1j on the side connected to the ground potential portion GND are connected in series. Furthermore, a signal obtained at the connection point is supplied to one input terminal of the operational amplifier 22.

Also, with regard to the other detecting sections (COS detecting section 20-2, −SIN detecting section 20-3, and SIN detecting section 20-4), as illustrated in FIG. 13, ten compact arrangement sections are alternately connected in series, and the predetermined voltage V is applied to one series circuit, while the other series circuit is connected to the ground potential portion GND. Then, the signals at the respective connection points are supplied to the input terminals of the operational amplifier 22 or 23.

In this manner, the detection signal of the −COS signal and the detection signal of the COS signal are supplied to the operational amplifier 22, and amplified by the operational amplifier 22 to give a COS signal. Similarly, the detection signal of the −SIN signal and the detection signal of the SIN signal are supplied to the operational amplifier 23, and amplified by the operational amplifier 23 to give a SIN signal.

With the configuration illustrated in FIG. 13, a summation signal of the signals obtained by two sets of five compact arrangement sections that are arranged at the intervals of 180° (=½λ) is supplied to the operational amplifiers 22 and 23, respectively, so that even-order distortions are canceled by the bridge connection.

A summation signal of the signals obtained by two sets of five compact arrangement sections in this manner, so that even if there is a variation in the leakage magnetic field from the magnetic scale 11, the variations in the level of the COS signal and SIN signal obtained by the operational amplifiers 22 and 23 can be suppressed as small as possible.

As described above, the position detecting device including the detecting section with the element arrangement illustrated in FIG. 11 and FIG. 12 can detect an extremely favorable signal with the harmonic distortions up to the 7th order removed. In particular, the magnetism detecting elements 21 for the 3rd, 5th, and 7th order harmonic reduction are compactly arranged inside one compact arrangement section, so that up to 7th order harmonic distortions can be removed from the signal within the same wavelength distance. Furthermore, the resistive elements of two sets of five compact arrangement sections are summed to give a signal, so that favorable distortion-removal excluding the influences, such as the variations in the level of the magnetic scale 11, can be performed.

Moreover, the elements for reduction of the relatively higher level lower-order harmonic distortions among the 3rd, 5th, and 7th order harmonic distortions are preferentially arranged on the same track as the element serving as the reference, so that more effective distortion removal can be achieved. Specifically, two magnetism detecting elements at the positions away from each other by λ/6 in the longitudinal direction of the magnetic scale 11 are arranged for reducing the 3rd order harmonic distortion. Because these two magnetism detecting elements are not far away from each other in the direction orthogonal to the longitudinal direction (detection direction) of the magnetic scale 11, it is possible to reliably reduce the 3rd order harmonic distortion.

Moreover, because two magnetism detecting elements for reducing the 5th order harmonic distortion are also arranged at the positions away from each other by λ/10 in the longitudinal direction of the magnetic scale 11, these two magnetism detecting elements are not far away from each other in the direction orthogonal to the longitudinal direction (detection direction) of the magnetic scale 11. Therefore, it is also possible to reliably reduce the 5th order harmonic distortion.

2-3. Example of Configuration for Removing Higher-Order Distortions

In the example illustrated in FIG. 11 to FIG. 13, a configuration has been described for removing the up to 7th order harmonic distortions. In contrast, further-higher-order distortions may be removed.

Figure 14:
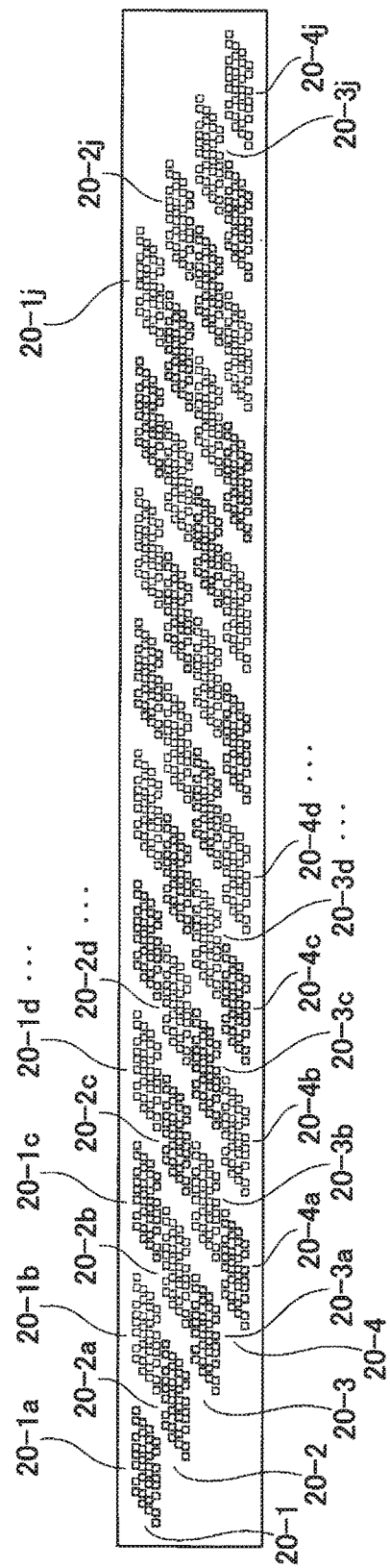
FIG. 14 is a configuration diagram illustrating an example obtained by evolving the example of the element arrangement according to the second embodiment of the present invention, so as to further reduce higher-order harmonic distortions.

Here, the configuration of a compact arrangement section for removing the up to 13th order harmonic distortions is described. FIG. 14 illustrates an example of the compact arrangement sections 20-1a to 20-1j, 20-2a to 20-2j, 20-3a to 20-3j, 20-4a to 20-4j for removing the up to 13th order harmonic distortions.

Specific arrangement intervals between the magnetism detecting elements 21 required for removing the up to 13th order harmonic distortions are described. The intervals between the magnetism detecting elements 21 required for cancelling the odd (3rd to 13th) order harmonic distortions when one wavelength λ of the magnetic scale 11 is 400 μm are as follows.

The 3rd order: 66.6 μm
The 5th order: 40 μm
The 7th order: 28.57 μm
The 9th order: 22.2 μm
The 11th order: 18.18 μm
The 13th order: 15.38 μm Here, the 9th order harmonic has three times the frequency of the 3rd order harmonic, and the interval 66.6 μm of the cancellation pattern of the 3rd order harmonic is the interval of 1.5 times the frequency λ of the 9th order harmonic. Therefore, the phase of the 9th order harmonic is opposite at exactly the position with the interval and thus the 9th order harmonic can be cancelled. As described above, an odd-order but not prime-order harmonic has always the frequency odd-number times of certain lower-order odd-order harmonic and therefore can be cancelled using the cancellation pattern of the certain lower-order odd-order harmonic.

Most of the 9th order harmonic distortion can be canceled using a pair of elements that reduce the 3rd order harmonic in this manner. Therefore, a pair of elements for the 9th order harmonic reduction do not necessarily need to be arranged.

That is, when the number of element arrangements is determined using the above-described formula $L=(\lambda/2)\times(1/3+1/5+1/7+ \ldots 1/(2m+1))$, the terms of the order of a number that is an odd number but not a prime number are excluded and q-th power of 2 magnetism detecting elements (q is the number of prime numbers from 3 to 2 m+1) are arranged.

Therefore, in the case of removing the up to 13th order harmonic distortions, the pairs of elements for the 3rd, 5th, 7th, 11th, and 13th order harmonic reduction, excluding the pair of elements for the 9th order harmonic reduction, are arranged inside the compact arrangement section at the intervals below.

The 3rd order: 66.6 μm
The 5th order: 40 μm
The 7th order: 28.57 μm
The 11th order: 18.18 μm
The 13th order: 15.38 μm Inside one compact arrangement section, $32(=2^5)$ magnetism detecting elements 21 are arranged at these intervals. That is, among 3rd, 5th 7th, 9th, 11th, and 13th from the 3rd to 13th order, there are five prime numbers, i.e., 3, 5, 7, 11, and 13, thus resulting in $2^5=32$.

If the size of one magnetism detecting element 21 is approximately 10 by 10 μm, all the elements cannot be arranged on the same track position and therefore here, as illustrated in FIG. 14, a row having eight elements arranged in the longitudinal direction of the magnetic scale 11 is arranged in 4 columns in the width direction.

As illustrated in FIG. 14, when 32 magnetism detecting elements 21 are arranged inside the respective compact arrangement sections, first the elements for the lower order (3rd and 5th order) harmonic reduction are preferentially arranged on the same track (the first track). Furthermore, a pair of elements for the 13th order harmonic distortion reduction that can be arranged on the first track are arranged, and a total of eight elements are arranged on the first track.

Then, the elements for the 7th order harmonic distortion reduction and the elements for the 11th order harmonic distortion reduction are arranged separately onto the second, third, and fourth tracks that are shifted to each other in the width direction. Also in this case, the elements for the lower-order distortion reduction are arranged from a track closer to the track, on which the element that detects the signal (1st order) serving as the reference is arranged. In this manner, the up to 13th order harmonic distortions can be reduced using a compact arrangement section in which 32 magnetism detecting elements 21 are compactly arranged in 4 columns.

Even in the case of reducing the up to 13th order harmonic distortions, the configurations illustrated in FIG. 11 and/or FIG. 13 can be directly applied to the connection state of a plurality of compact arrangement sections.

Note that, also in any one of the examples of the embodiments described above, the pattern arrangements of four element groups, i.e., the COS detecting section, the −COS detecting section, the SIN detecting section, and the −SIN detecting section, are the same, and four detecting sections have an equal detection performance, as a result. Accordingly, the COS, −COS, SIN, and −SIN signals can be detected as a signal of the same quality.

Then, these four detecting sections are arranged offset to each other in the longitudinal direction by the interval of a necessary minimum phase difference equal to or less than one unit wavelength of the magnetic signal, and furthermore are arranged within the range shorter than one unit wavelength also in the direction orthogonal to the longitudinal direction, so that four detecting sections can perform signal detection in the best and same area where the detection is possible. Therefore, uniformity in the output and quality of the respective signals is favorable.

For example, in the magnetic records of the magnetic scale, suppose that there is a place where the magnetic record strength is weak (i.e., a place where the leakage magnetic field is weak) in one portion in the longitudinal direction (e.g., one wavelength).

In the case of the conventional detection element (including the AMR element, for example), in the respective COS detecting section, −COS detecting section, SIN detecting section, and −SIN detecting section, the detecting sections are forwardly-and-backwardly nested to each other in the longitudinal direction, but the element arrangements in the respective detecting sections are shifted to each other. Therefore, the signals at the places where the magnetic record strength is weak are detected at different timings, not simultaneously. As a result, for example, when the SIN detecting section performs the normal detection, the COS detecting section passes a place where the magnetic record strength is weak, and thus the amplitude of the detection signal will decrease. Therefore, the gain balance between the SIN signal and the COS signal is lost and thus the position signal calculated from the SIN signal and the COS signal will also decrease in accuracy.

Then, the above-described phenomenon occurs every time each detection element passes a place where the magnetic record strength is weak, leading to a decrease in accuracy multiple times.

On the other hand, in the configurations of the examples of the first and second embodiments described above, the COS detecting section, the −COS detecting section, the SIN detecting section, and the −SIN detecting section have the same arrangement of respective sets of detection elements, wherein in the arrangement in the longitudinal direction of the respective sets of detection elements, the respective different phase-differences are set to the minimum phase difference at a distance smaller than one unit wavelength of the magnetic signal.

Accordingly, the SIN signal and COS signal at the places where the magnetic record strength is weak within the same wavelength distance will be detected and thus the amplitude of the detection signal with the same wavelength will decrease. That is, both the SIN signal and the COS signal will decrease in amplitude with the minimum phase difference similarly to each other. In this case, both the SIN signal and the COS signal decrease in amplitude equally and at almost the same time, so that the deterioration of the gain balance is significantly improved as compared with the conventional art.

As described above, with respect to the variation in the longitudinal direction of the scale and the variation in the direction orthogonal to the longitudinal direction, the detecting sections receive the same influence at almost the same time and thus all the signals vary similarly to each other. As a result, the variation in the gain balance between the SIN signal and the COS signal will decrease although there is a variation in the gain, thus allowing for more accurate position detection.

3. Example of Third Embodiment

Hereinafter, an example of a third embodiment of the present invention is described with reference to FIG. 1, and FIG. 15 to FIG. 20.

Note that the configuration described in the third embodiment may be combined with the configuration or configurations described in other embodiments (e.g., first, second, and/or fourth embodiments) described herein.

3-1. Configuration Example of Position Detecting Device

Figure 1:
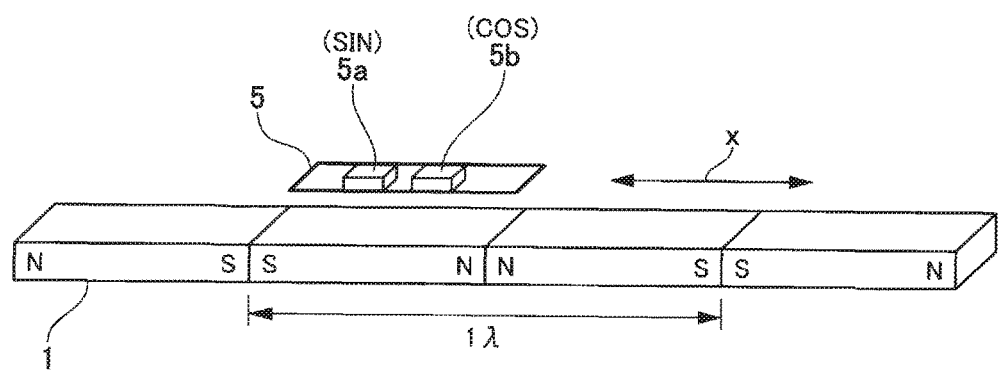
FIG. 1 is a perspective view illustrating an arrangement example of a conventional magnetic scale and magnetism detecting elements.
Figure 2:
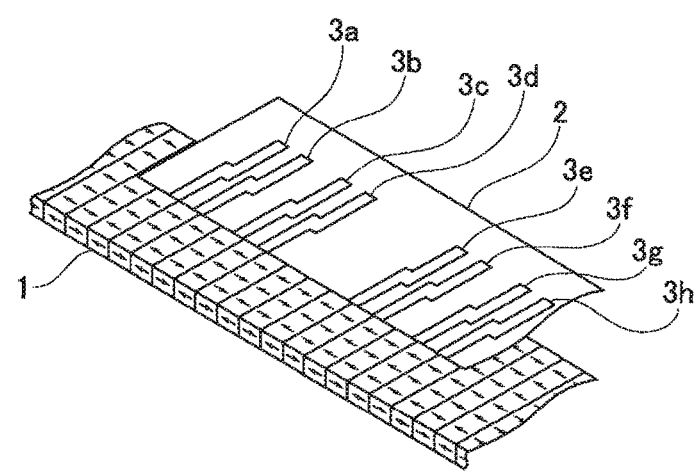
FIG. 2 is an explanatory view illustrating an arrangement example of a magnetic scale and magnetism detecting elements of a conventional position detecting device.
Figure 3:
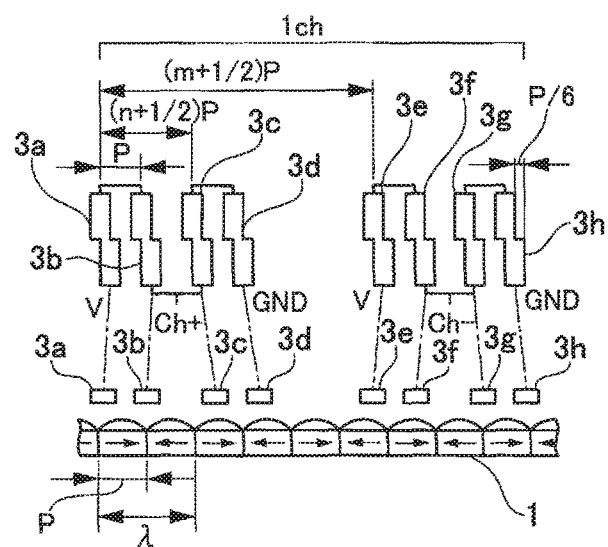
FIG. 3 is a plan view and a cross sectional view illustrating a detailed arrangement state of the magnetism detecting elements illustrated in FIG. 2.
Figure 4:
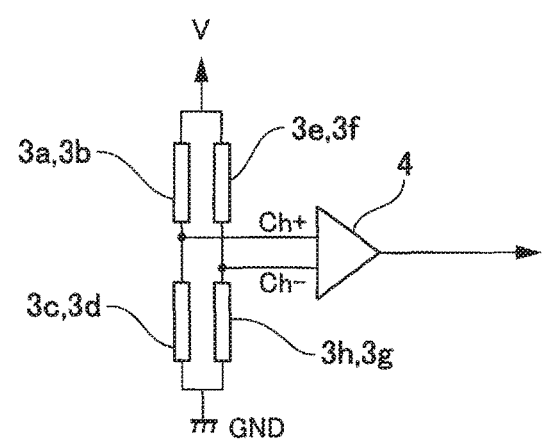
FIG. 4 is a configuration diagram illustrating an example of the connection of the conventional magnetism detecting elements.
Figure 5:
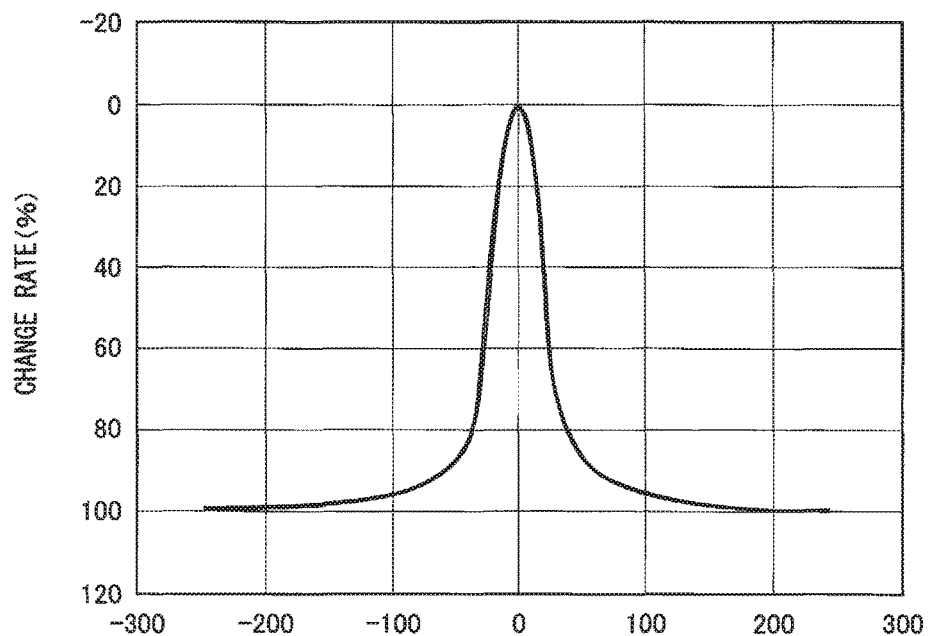
FIG. 5 is a characteristic chart illustrating an example of the detection characteristic of magnetic field vs. resistance of the conventional magnetism detecting element (AMR element).

To the whole configuration of a position detecting device of the example of the third embodiment, the configuration of FIG. 1 is applicable, for example. That is, as illustrated in FIG. 6, the device 100 detects the moving distance of the movable stage 102 in a machining tool including the movable stage 102 moveably arranged on the stationary section 101.

The work piece 103 is secured to the movable stage 102, and is machined by the machining tool 105. The position of the movable stage 102 varies with the drive by the drive section 106.

The magnetic scale 11 is arranged on the movable stage 102. The magnetic scale 11 is configured to attach a magnetic medium having signals recorded thereon, the signal having magnetized the magnetic medium alternately to the N pole and S pole for each constant distance, to the surface of the metal plate. The magnetic scale 11 is formed to a length equal to or greater than the maximum distance of the movement detected by the device 100.

Moreover, the detecting section 20 is arranged on the stationary section 101 side and is close to the magnetic scale 11. Then, the detection element (the magnetism detecting element 21 illustrated in FIG. 15) inside the detecting section 20 detects the signal recorded in the magnetic scale 11. Here, the detecting section 20 includes a plurality of detection elements, wherein the recording signals, i.e., the sinusoidal signal (SIN signal) and the cosine signal (COS signal), of the magnetic scale 1 are detected using the respective detection elements.

The SIN signal and COS signal detected by the detecting section 20 are supplied to the position detecting section 104, and in the position detecting section 104, the relative position between the magnetic scale 11 and the detecting section 20 is calculated from these SIN signal and COS signal by arithmetic processing. The positional information calculated by the position detecting section 104 is supplied to the control section 107. The control section 107 calculates a difference between target-position information input from the target position input section 108 and the positional information supplied from the position detecting section 104, and generates a drive signal for moving the movable stage 102 by the difference. Then, the drive signal generated by the control section 107 is supplied to the drive section 106. The drive section 106 moves the movable stage 102 by a moving amount indicated by the supplied drive signal.

3-2. Configuration Example of Magnetism Detecting Elements and Arrangement Example of Bias Magnetic Field Application Section Next, referring to FIG. 15, the configuration example of the magnetism detecting elements included in the detecting section 20 and the arrangement example of the bias magnetic field application section are described.

Figure 15:
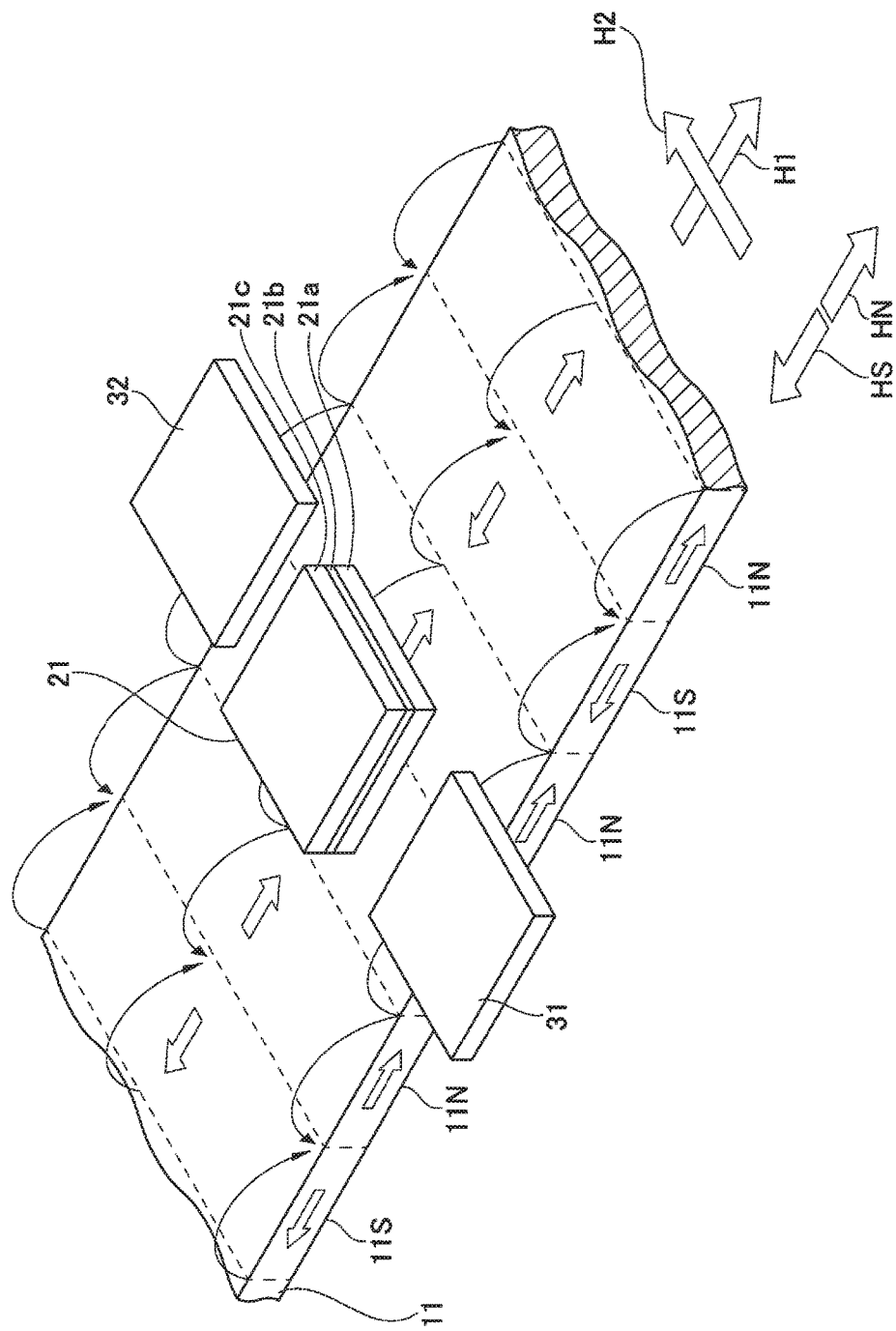
FIG. 15 is a fundamental view illustrating an arrangement example of magnetism detecting elements relative to a magnetic scale according to a third embodiment of the present invention.

The detecting section 20 that detects a signal from the magnetic scale 11 includes the magnetism detecting element 21 as illustrated in FIG. 15. The magnetism detecting element 21 is arranged close to the surface of the magnetic scale 11. Note that, FIG. 15 is a schematic view illustrating the positional relationship between the magnetic scale 11 and the magnetism detecting element 21, but the actual magnetism detecting element 21 may have a size smaller than that of the shape illustrated in FIG. 15. Moreover, although only one magnetism detecting element 21 is illustrated in FIG. 15, actually a plurality of magnetism detecting elements 21 is arranged in order to detect the respective SIN signal and COS signal.

In the magnetic scale 11, the N pole magnetization section 11N and the S pole magnetization section 11S are alternately formed for each constant distance. Here, in the magnetic scale 11, the N pole magnetization section 11N and the S pole magnetization section 11S are formed at the interval of 200 μm. For the signal detected by the magnetism detecting element 21, one period during which the N pole and S pole change is one wavelength. That is, the magnetic field directions HN caused by the N pole magnetization section 11N and the magnetic field directions HS caused by the S pole magnetization section 11S are reversed at each 200 μm and thus the length of one wavelength is 400 μm.

In the example, as the magnetism detecting element 21, the TMR element using the tunnel magneto-resistance effect is utilized. The magnetism detecting element 21, which is the TMR element, of the configuration illustrated in FIG. 8 is used, for example. That is, as illustrated in FIG. 8, the magnetism detecting element 21 includes three layers, i.e., the fixed layer 21a, the barrier layer 21b, and the free layer 21c.

The fixed layer 21a is a layer whose magnetization direction is fixed. Here, the magnetization direction H1 of the fixed layer 21a is the same as the magnetic field direction HN caused by the N pole magnetization section 11N as illustrated in FIG. 15.

The free layer 21c is a layer whose magnetization direction varies with the magnetic field leaking from the magnetic scale 11. These fixed layer 21a and free layer 21c are ferromagnetic layers, and the barrier layer 21b is an insulating layer. When the magnetization directions of the fixed layer 21a and the free layer 21c are the same, the whole resistance value of the element 21 decreases, while when the magnetization directions of the fixed layer 21a and the free layer 21c are opposite to each other, the whole resistance value of the element 21 increases. The TMR element is characterized in that the variation of the resistance value due to the variation of the magnetization direction is very large. The details of the variation of the resistance value of the magnetism detecting element 21 will be described later.

Then, in the example, as illustrated in FIG. 15, bias magnetic field generation sections 31 and 32 are arranged near the magnetism detecting element 21. The two bias magnetic field generation sections 31 and 32 are adjacent to each other in a direction substantially orthogonal to the longitudinal direction of the magnetic scale 11, and are arranged so as to sandwich the free layer 21c of the magnetism detecting element 21. The direction of the bias magnetic field generated by the two bias magnetic field generation sections 31 and 32 is set to the magnetization direction H2 substantially orthogonal to the magnetization direction H1 of the fixed layer 21a. When there is no external magnetic field leaking from the magnetic scale 11, the magnetization direction of the free layer 21c of the magnetism detecting element 21 is generally the direction H2 of the bias magnetic field.

Note that, the two bias magnetic field generation sections 31 and 32 that generate the magnetization direction H2 of the bias magnetic field are preferably arranged in a direction slightly shifted from the direction orthogonal to the magnetization direction H1, which will be described later. Moreover, while a plurality of magnetism detecting elements 21 is arranged as described above, the bias magnetic field generation sections 31 and 32 are individually arranged in all the magnetism detecting elements 21 so that each of the bias magnetic field generation sections 31 and 32 applies a bias magnetic field to the individual magnetism detecting element 21.

3-3. Principle of Detecting Scale Magnetic Field by Magnetism Detecting Element Next, the principle of detecting the magnetic field of the magnetic scale 11 by the magnetism detecting element 21 is described.

Figure 16:
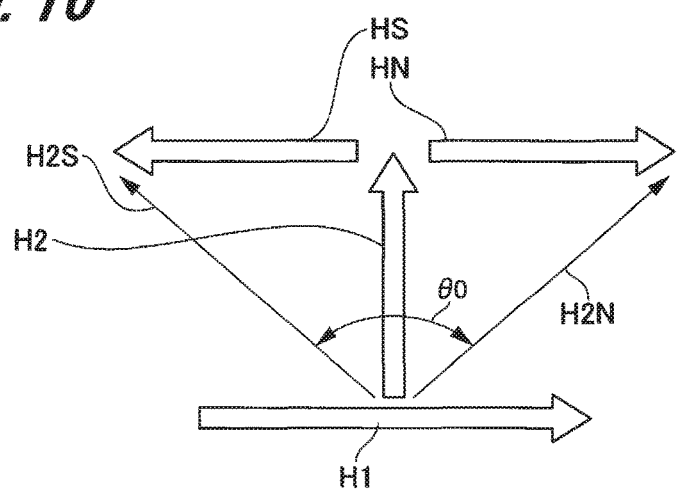
FIG. 16 is a diagram illustrating how the magnetism detecting element according to the third embodiment of the present invention varies its magnetization direction by the magnetic field of the scale.

FIG. 16 illustrates a relationship among the magnetization direction H1 of the fixed layer 21a, the magnetization direction H2 of the free layer 21c caused by the bias magnetic field, and the magnetic field directions HN, HS of the magnetic scale 11.

As illustrated in FIG. 16, the magnetization direction H1 of the fixed layer 21a is the same as the magnetic field direction HN of the N pole magnetization section 11N of the magnetic scale 11, and is the direction 180° opposite to the magnetic field direction HS of the S pole magnetization section 11S.

Then, without the influence of the magnetic field of the magnetic scale 11, the magnetization direction H2 of the free layer 2c caused by the bias magnetic field is the direction orthogonal to the magnetization direction H1 of the fixed layer 21a.

Here, when the magnetism detecting element 21 detects the signal of the magnetic scale 11, magnetization directions H2N, H2S obtained by combining the magnetization direction H2 of the free layer 21c caused by the bias magnetic field and the magnetic field directions HN, HS of the magnetic scale 11 are the magnetization direction of the free layer 21c.

That is, when the magnetism detecting element 21 is positioned above the N pole magnetization section 11N of the magnetic scale 11, the magnetization direction H2N obtained by combining the magnetization direction H2 of the free layer 21c and the magnetization direction HN of the N pole magnetization section 11N is the magnetization direction of the free layer 21c. Moreover, when the magnetism detecting element 21 is positioned above the S pole magnetization section 11S of the magnetic scale 11, the magnetization direction H2S obtained by combining the magnetization direction H2 of the free layer 21c and the magnetization direction HS of the S pole magnetization section 11S is the magnetization direction of the free layer 21c.

Accordingly, as the output signal of the magnetism detecting element 21, the angle θ0 formed between the magnetization direction H2N that is detected when the magnetism detecting element 21 is positioned above the N pole magnetization section 11N and the magnetization direction H2S that is detected when the magnetism detecting element 21 is positioned above the S pole magnetization section 11S is preferably large.

The relationship between the magnetization direction of each layer inside the magnetism detecting element 21 and the resistance value is illustrated in FIGS. 9A to 9C. That is, when the magnetization direction of the free layer 21c is 0°, the resistance value of the magnetism detecting element 21 is the minimum, while when the magnetization direction of the free layer 21c is 180°, the resistance value of the magnetism detecting element 21 is the maximum. Then, as apparent from the curve of the characteristic illustrated in FIG. 9C, when the magnetization direction of the free layer 21c is an angle between 0 and 180°, a resistance value corresponding to the angle can be obtained.

Here, the bias magnetic field generation sections 31 and 32 illustrated in FIG. 15 are provided, and then as illustrated in FIG. 9C, a zero-magnetic-field position X when there is a bias magnetic field is set so that the spin direction becomes the direction substantially orthogonal to the magnetization direction in the state (=no-magnetic field state) where there is no magnetic field of the magnetic scale 11, at substantially the middle between 0° and 180°.

By generating the bias magnetic field in this manner, the magnetism detecting element 21 including the TMR elements will perform the detection operation at the places where the linearity is excellent.

3-4. Influences from Bias Magnetic Field

Next, the influence from the bias magnetic field is described.

As illustrated in FIG. 16, if the bias magnetic field is set geometrically orthogonal to the magnetic field directions HS, HN of the magnetic scale 11, then depending on the intensity of the bias magnetic field, the magnetization direction H2 of the free layer 21c of the magnetism detecting element 21 may not rotate so as to be orthogonal to the bias magnetic field. The magnetization direction H2S of the free layer 21c illustrated in FIG. 16 illustrates a case where there is an influence of the magnetic field direction HS of the magnetic scale 11. Moreover, the magnetization direction H2N of the free layer 21c illustrated in FIG. 16 illustrates a case where there is an influence of the magnetic field direction HN of the magnetic scale 11.

An increase of the bias magnetic field can reliably rotate the magnetization direction of the free layer 21c, but in this case, the quantity of the bias magnetic field increases relative to the scale magnetic field and therefore the angle θ0, by which the magnetization direction varies relative to the same scale magnetic field, will decrease.

Figure 17A:
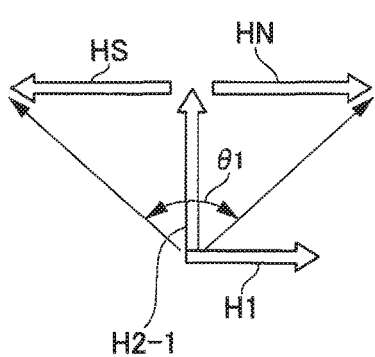
FIGS. 17A and 17B are diagrams illustrating an example of variation of the detection state with the magnitude of a bias magnetic field.
Figure 17B:
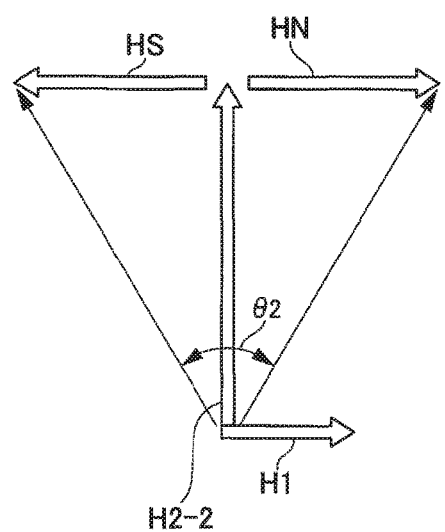

FIGS. 17A and 17B illustrate a comparison between a case where the bias magnetic field is weak and a case where the bias magnetic field is strong.

FIG. 17A is an example when the bias magnetic field H2-1 is weak. In such a case where the bias magnetic field H2-1 is weak, the magnetization direction obtained by combining the magnetization direction HN of the N pole magnetization section 11N of the magnetic scale 11 and the bias magnetic field H2-1 is detected, or the magnetization direction obtained by combining the magnetization direction HS of the S pole magnetization section 11S of the magnetic scale 11 and the bias magnetic field H2-1 is detected. Accordingly, the range of the variations of the magnetization direction detected by the magnetism detecting element 21 is an angle θ1.

FIG. 17B is an example when the bias magnetic field H2-2 is strong. Also in such a case where the bias magnetic field H2-2 is strong, the magnetization direction obtained by combining the magnetization direction HN of the N pole magnetization section 11N and the bias magnetic field H2-2 is detected, or the magnetization direction obtained by combining the magnetization direction HS of the S pole magnetization section 11S of the magnetic scale 11 and the bias magnetic field H2-2 is detected. This situation is the same as the case illustrated in FIG. 17A. However, in the case of the example illustrated in FIG. 17B, the range of the variations of the magnetization direction detected by the magnetism detecting element 21 is an angle θ2. The angle range θ2 when the bias magnetic field H2-2 is strong will be narrower than the angle range θ1 when the bias magnetic field H2-2 is weak.

The fact that the angle range θ2 when the bias magnetic field H2-2 is strong is narrower means that the resistance variation due to the variation of the magnetic field of the magnetic scale 11 will decrease and the amplitude of the output signal of the magnetism detecting element 21 will decrease, which is not preferable in securing detection accuracy.

As another problem different from the problem of the strength of the bias magnetic field described above, there is a problem that the resistance change of the magnetism detecting element 21 is not perfectly symmetric between the plus direction and the minus direction. That is, the center of the resistance change of the magnetism detecting element 21 is not necessarily located at the center of the range of the angle θ1 or θ2 illustrated in FIGS. 17A and 17B. Furthermore, as described above, there is a problem that the amplitude of the output signal of the magnetism detecting element 21 decreases when the bias magnetic field is increased. In order to solve these problems at the same time, in the example, the bias magnetic field is set to an appropriate strength and furthermore the direction along which the bias magnetic field is applied is set to a direction slightly shifted from the direction geometrically orthogonal to the longitudinal direction of the magnetic scale 11.

That is, the direction of the bias magnetic field is variably set so that with no magnetic field from the magnetic scale 11, the resistance value of the magnetism detecting element 21 becomes the midpoint between substantially the maximum resistance value and minimum resistance value.

Figure 18A:
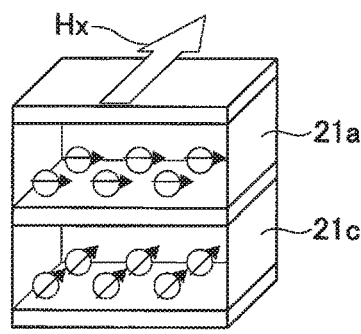
FIGS. 18A to 18D are diagrams illustrating an example of the relationship between the bias magnetic field and scale magnetic field according to the third embodiment of the present invention.

FIGS. 18A to 18D illustrate how the resistance value becomes the midpoint. FIG. 18A illustrates a state where only the bias magnetic fields from the bias magnetic field generation sections 31 and 32 are applied to the free layer 21c. The direction of the bias magnetic field in FIG. 18A is set to the direction when the resistance value of the magnetism detecting element 21 becomes an intermediate value R0 between the minimum resistance value and the maximum resistance value.

Figure 18B:
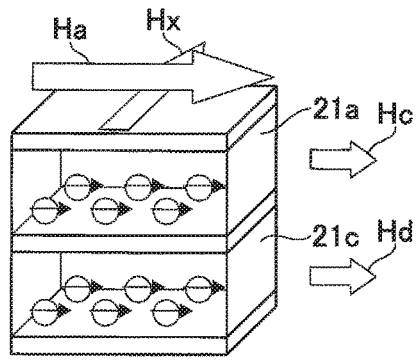
Figure 18C:
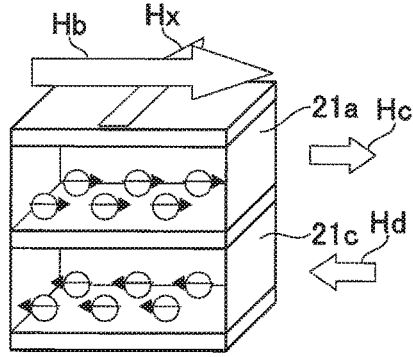

FIGS. 18B and 18C illustrate the state where with the bias magnetic field applied, one magnetic field or the other magnetic field from the magnetic scale 11 is detected. In the state illustrated in FIG. 18B, the magnetization direction of the fixed layer 21a of the magnetism detecting element 21 and the magnetization direction of the free layer 21c are the same, while in the state illustrated in FIG. 18C, the magnetization direction of the fixed layer 21a of the magnetism detecting element 21 and the magnetization direction of the free layer 21c differ from each other by 180°.

The magnetism detecting element 21 has the minimum resistance value R1 in the state illustrated in FIG. 18B and has the maximum resistance value R2 in the state illustrated in FIG. 18C.

Figure 18D:
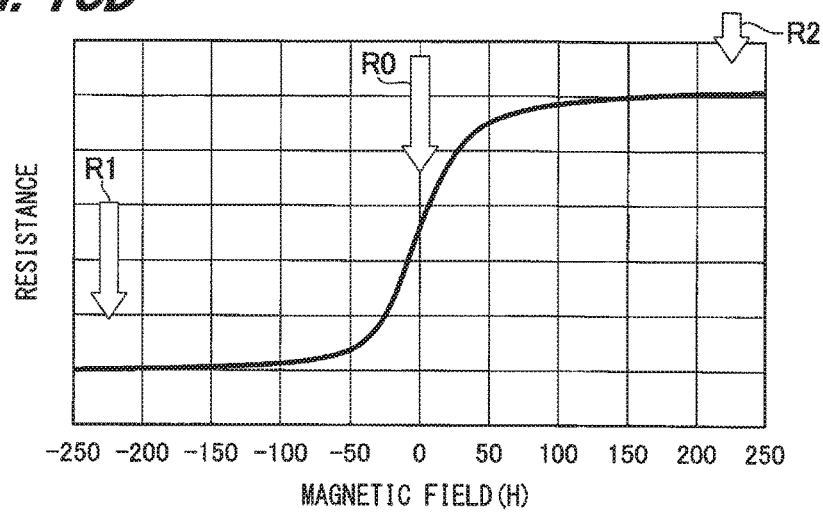

FIG. 18D illustrates a relationship among the minimum resistance value R1, the maximum resistance value R2, and the intermediate value R0 of the magnetism detecting element 21. In this manner, the resistance value R0 of the magnetism detecting element 21 when only the bias magnetic field is applied to the free layer 21c is set to the intermediate value between the minimum value R1 and the maximum value R2, so that the characteristic of the magnetism detecting element 21 becomes symmetric with respect to the alternating magnetic field of the magnetic scale 11.

Figure 19A:
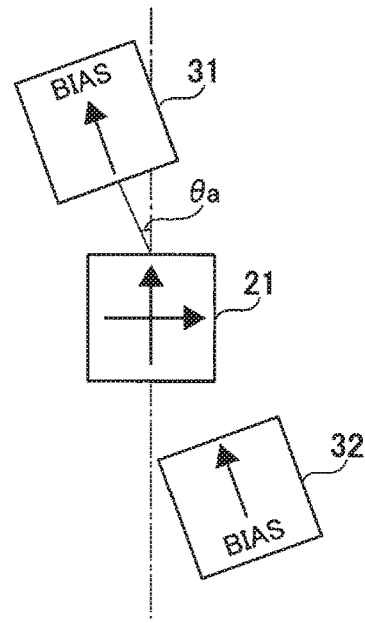
FIG. 19A is a diagram illustrating an example of the appropriate bias magnetic field and FIG. 19B is a diagram illustrating an example of an orthogonal bias magnetic field according to the third embodiment of the present invention.
Figure 19B:
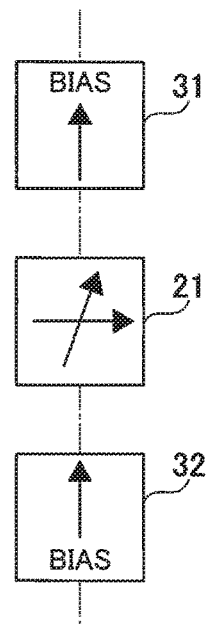

FIGS. 19A and 19B illustrate an example of the bias magnetic field which the bias magnetic field generation sections 31 and 32 apply to the magnetism detecting element 21.

FIG. 19A illustrates a case where the bias magnetic field generation sections 31 and 32 apply the bias magnetic field at an angle shifted by an angle θa from the direction orthogonal to the magnetization direction of the fixed layer 21a of the magnetism detecting element 21. This is the state when the magnetism detecting element 21 has the intermediate resistance value R0 illustrated in FIG. 18D. The angle θa is approximately 10°, for example, although it varies in accordance with the arrangement state of the magnetism detecting elements 21 and the like.

The arrangement state of the bias magnetic field generation sections 31 and 32 is set to the state illustrated in FIG. 19A, so that the quantity of magnetism applied to the magnetism detecting element 21 will accurately match the resistance value detected by the magnetism detecting element 21, in a certain relationship. Accordingly, the detection with less signal distortion is possible, thus contributing to higher accuracy of the positional information detected by the position detecting device.

FIG. 19B illustrates an example, for reference, of the case where the bias magnetic fields which the bias magnetic field generation sections 31 and 32 apply to the magnetism detecting element 21 are orthogonal to the alternating magnetic field of the magnetic scale 11. In the case of FIG. 19B, a resistance value shifted from the intermediate resistance value R0 will be detected, which is not preferable.

Figure 20:
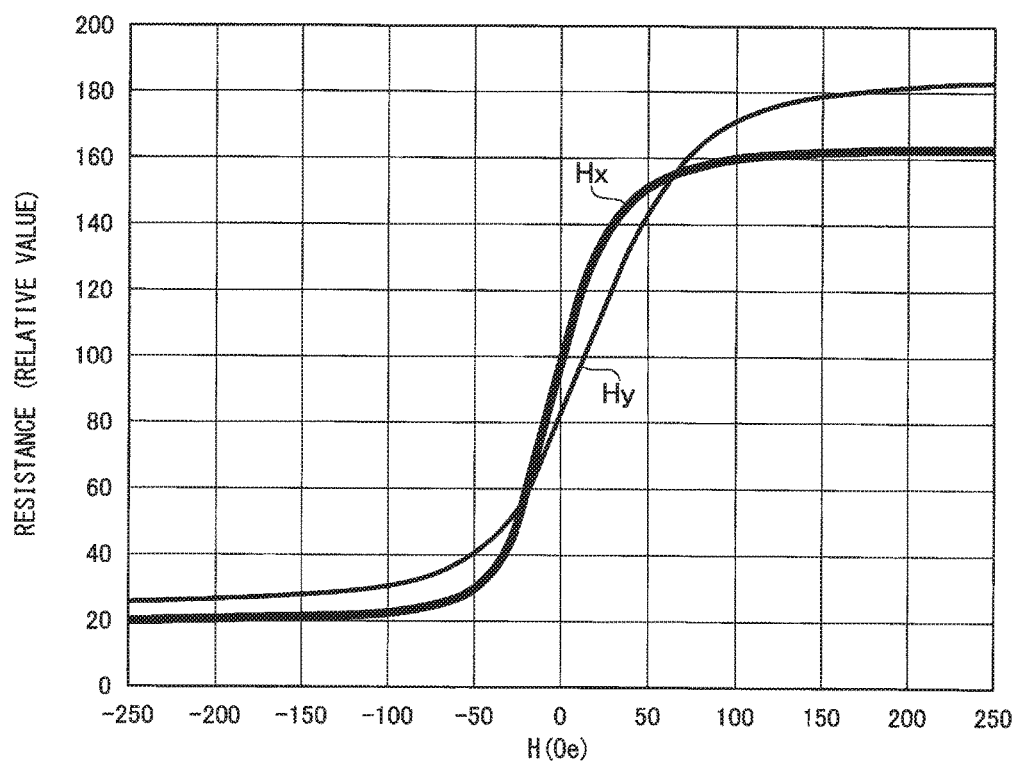
FIG. 20 is a diagram illustrating an example of the changes of the characteristic detected by a magnetism detecting element due to the direction of a bias magnetic field.

FIG. 20 illustrates a change characteristic Hx of the resistance value in the case where the bias magnetic field generation sections 31 and 32 are arranged with the angle θa shifted from the orthogonal position as illustrated in FIG. 19A, and a change characteristic HY of the resistance value in the case where the bias magnetic field generation sections 31 and 32 are arranged at the orthogonal position as illustrated in FIG. 19B.

The horizontal axis of FIG. 20 represents the intensity (Oe) of the alternating magnetic field of the magnetic scale 11, and the vertical axis represents the resistance value. Note that the resistance value is a relative value in the case where the resistance value when the external magnetic field Hx is zero is set to 100.

As apparent from FIG. 20, the characteristic Hx in the case where the bias magnetic field generation sections 31 and 32 are arranged with the angle θa shifted from the orthogonal position is located at the center of the change in resistance value when the alternating magnetic field of the magnetic scale 11 is 0[Oe]. That is, the resistance change characteristic curve of the magnetism detecting element 21 is approximately 180° symmetric with respect to the resistance value when the external magnetic field is 0.

On the other hand, the characteristic Hy in the case where the bias magnetic field generation sections 31 and 32 are arranged at the orthogonal position is shifted from the center of the change in resistance value when the alternating magnetic field of the magnetic scale 11 is 0[Oe].

In this manner, according to the position detecting device of the example of the third embodiment, the resistance change characteristic of the magnetism detecting element 21 will exhibit a characteristic symmetric with respect to the position where the bias magnetic field is applied, so that the characteristic can be obtained which varies symmetrically with respect to the alternating magnetic field of the magnetic scale 11. This means that the magnetism detecting element 21 converts the quantity of magnetism applied to the element into a resistance value, in a state where the quality of conversion characteristic is excellent. Therefore, the position detecting device of the example will perform the position detection with a smaller signal distortion, thus contributing to an increase in accuracy of the position detection.

Note that, as described above, it is most preferable to set the bias magnetic field applying direction to a direction slightly shifted from the direction orthogonal to the alternating magnetic field of the magnetic scale 11, but as illustrated in FIG. 19B, even when the bias magnetic field is applied to the direction orthogonal to the alternating magnetic field of the magnetic scale 11, a certain level of improvement effect of the characteristic is obtained. That is, as described in FIG. 18D, by moving the operating point by applying the bias magnetic field, the resistance can be varied using the area where the sensitivity (=change rate) to the magnetic field is high. Accordingly, a signal with a large amplitude and an excellent S/N ratio suitable for accurate signal processing can be obtained.

4. Example of Fourth Embodiment

Next, an example of a fourth embodiment of the present invention is described with reference to FIG. 21 to FIG. 24. In the example of the fourth embodiment, the present invention is applied to a magnetic scale-type position detecting device using a magnetic scale. As an apparatus on which the position detecting device is mounted, the apparatus 100 as the machining tool illustrated in FIG. 6 is applicable, for example.

Note that the configuration described in the fourth embodiment may be combined with the configuration or configurations described in other embodiments (e.g., first, second, and/or third embodiments) described herein.

4-1. Arrangement of Magnetic Scale and Head

Figure 21:
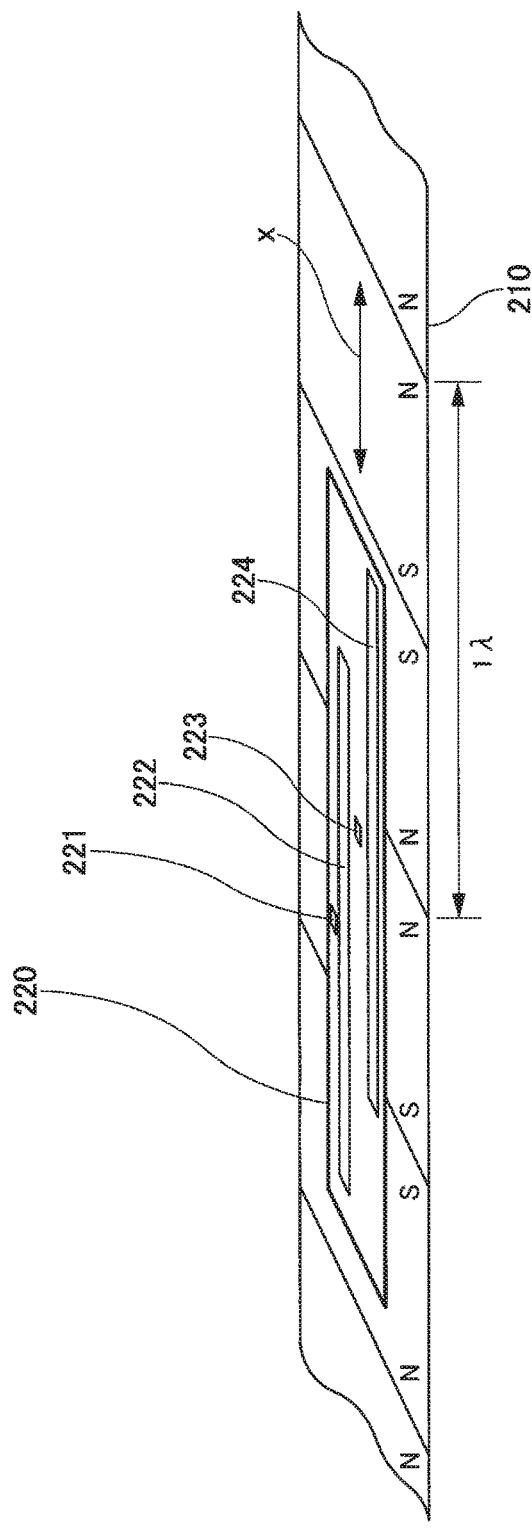
FIG. 21 is a perspective view illustrating an arrangement example of a magnetic scale and head according to a fourth embodiment of the present invention.
Figure 22:
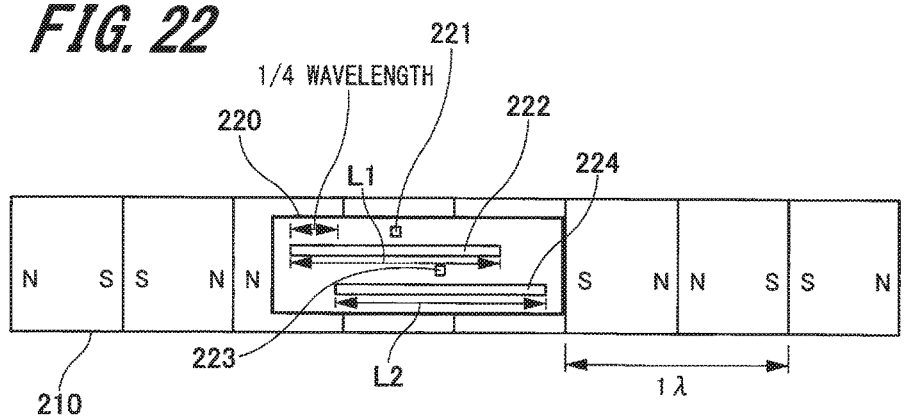
FIG. 22 is a plan view illustrating an arrangement example of the magnetic scale and head according to the fourth embodiment of the present invention.

FIG. 21 and FIG. 22 illustrate an arrangement example of the magnetic scale and magnetic head of the position detecting device of the example. FIG. 21 is a perspective view, while FIG. 22 is a plan view of the overlapped magnetic scale and magnetic head.

As illustrated in FIG. 21, a magnetic scale 210 is configured to attach a magnetic medium having signals recorded thereon, the signal having magnetized the magnetic medium alternately to the N pole and S pole for each constant distance, to the surface of the metal plate. The magnetic scale 210 is formed to a length equal to or greater than the maximum distance of the movement detected by the position detecting device. One period during which the N pole and S pole change is one wavelength. The length of one wavelength is 400 μm, for example.

A magnetic head 220 is mounted on an object (not shown) that moves in the longitudinal direction (x direction) of the magnetic scale 210, and moves while keeping a constant interval (clearance) from the surface of the magnetic scale 210. When one wavelength of the signal recorded in the magnetic scale 210 is 400 μm, the clearance between the magnetic scale 210 and the magnetic head 220 is selected within a range from approximately 150 μm to 350 μm, for example. As one example, the clearance is set to 250 μm.

A magnetic head 20 includes a plurality of magnetic sensors 221, 222, 223, and 224 that detects the recording signal of the magnetic scale 210. As each of the magnetic sensors 221 to 224, an AMR (Anisotropic Magneto Resistive) element or a TMR (Tunnel Magneto Resistance) element is used, for example. In a magnetic sensor formed from these elements, the resistance value thereof varies with a change in the magnetization direction of the recording signal. One wavelength and the value of clearance described above are the values that are applied when the TMR element is used as the magnetic sensor.

Among the four magnetic sensors 221, 222, 223, and 224 included in the magnetic head 220, the magnetic sensor 221 is a sensor that detects the recording signal as a sinusoidal signal (SIN signal). Moreover, the magnetic sensor 223 is a sensor that is arranged at a position shifted by the distance of ¼ wavelength in the longitudinal direction of the magnetic scale 210 from the magnetic sensor 221 and detects the recording signal as the cosine signal (COS signal). These magnetic sensors 221 and 223 serve as the main sensor that detects the SIN signal and COS signal. The magnetic sensor 221 that detects the SIN signal and the magnetic sensor 223 that detects the COS signal are the sensors that detect a magnetic field leaking into a space from the magnetization recorded in the magnetic scale 210, and the length thereof in the x direction is sufficiently smaller than the length of one wavelength.

The magnetic sensor 222 is arranged adjacent to the magnetic sensor 221 that detects the SIN signal. Similarly, the magnetic sensor 224 is arranged adjacent to the magnetic sensor 223 that detects the COS signal.

These magnetic sensors 222 and 224 are arranged at positions adjacent to the adjacent magnetic sensor 221 or 223 in the direction orthogonal to the x direction.

As illustrated in FIG. 22, the lengths L1, L2 in the x direction of the magnetic sensors 222, 224 are set to a length equal to the length of one wavelength (1×λ) of the recording signal of the magnetic scale 210. For example, when one wavelength of the signal recorded in the magnetic scale 210 is 400 μm, the lengths L1, L2 in the x direction of the magnetic sensors 222, 224 are set to 400 μm.

In the example of FIG. 21 and FIG. 22, the magnetic sensor 221 is arranged adjacent to the center position in the x direction of the magnetic sensor 222 with the length of one wavelength. Similarly, the magnetic sensor 222 is arranged adjacent to the center position in the x direction of the magnetic sensor 224 with the length of one wavelength. Accordingly, the magnetic sensor 222 detects a signal at the same position as the magnetic sensor 221, while the magnetic sensor 224 detects a signal at the same position as the magnetic sensor 223. Note that the arrangement of the magnetic sensors 221, 223 at the center positions of the magnetic sensors 222, 224 is just an example. As long as the recording signal at substantially the same position can be detected with the pairs of magnetic sensors (sensors 221, 222 and sensors 223, 224), the magnetic sensors 221, 223 may be arranged at positions slightly shifted from the center positions of the magnetic sensors 222, 224.

From these magnetic sensors 222, 224, a signal obtained by averaging the magnetic field signals within the range of one wavelength of the recording signal of the magnetic scale 210 is detected. That is, the component (DC component) independent of the wavelength of the signal recorded in the magnetic scale 210 is detected from the magnetic sensors 222, 224, and therefore the magnetic sensors 222, 224 themselves have zero sensitivity to the wavelength of the signal recorded in the magnetic scale 210. Note that, the component independent of the wavelength is the component unnecessary for position detection, and corresponds to the noise independent of the signal for position detection recorded in the magnetic scale 210. In the description below, the detection signal of the magnetic sensor 222 arranged adjacent to the magnetic sensor 221 that detects the SIN signal is referred to as a SIN-DC signal, and the detection signal of the magnetic sensor 222 arranged adjacent to the magnetic sensor 221 that detects the COS signal is referred to as a COS-DC signal.

4-2. Example of Processing Output Signal of Each Sensor

Figure 23:
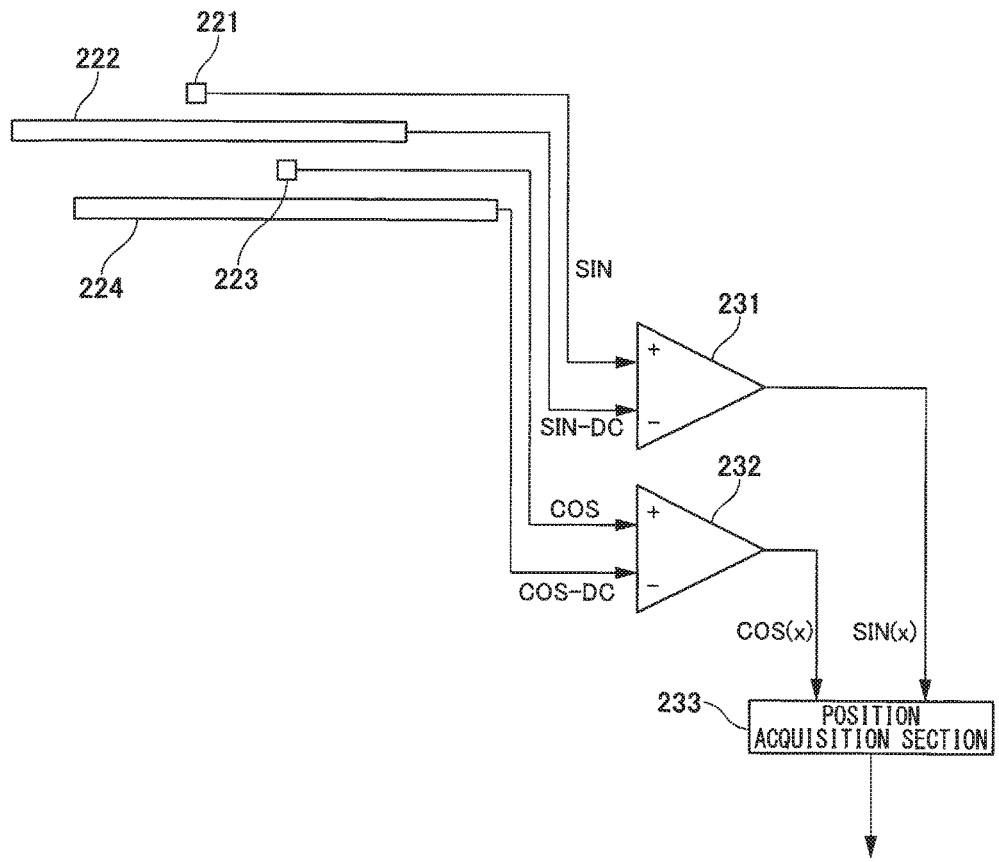
FIG. 23 is a block diagram illustrating an example of processing the output signal of each sensor according to the fourth embodiment of the present invention.

FIG. 23 illustrates a circuit configuration for processing the output signals of four magnetic sensors 221, 222, 223, and 224 arranged in the magnetic head 220.

The SIN signal detected by the magnetic sensor 221 and the SIN-DC signal detected by the magnetic sensor 222 are supplied to a subtractor 231. In the subtractor 231, a difference between the SIN signal output by the magnetic sensor 221 and the SIN-DC signal output by the magnetic sensor 222 is detected. The signal of the difference obtained by the subtractor 231 is supplied to a position acquisition section 233 as a sinusoidal detection signal SIN(x).

Moreover, the COS signal detected by the magnetic sensor 223 and the COS-DC signal detected by the magnetic sensor 224 are supplied to a subtractor 232. In the subtractor 232, a difference between the COS signal output by the magnetic sensor 223 and the COS-DC signal output by the magnetic sensor 224 is detected. The signal of the difference obtained by the subtractor 232 is supplied to the position acquisition section 233 as a cosine detection signal COS(x).

In the position acquisition section 233, a relative position x between the magnetic head 220 and the magnetic scale 210 is calculated by arithmetic processing using two supplied detection signals SIN(x) and COS(x). That is, a tangent signal TAN(x) is determined from the calculation of [detection signal SIN(x)/detection signal COS(x)], and the relative position x is calculated by determining the value x of the signal TAN(x).

Figure 24:
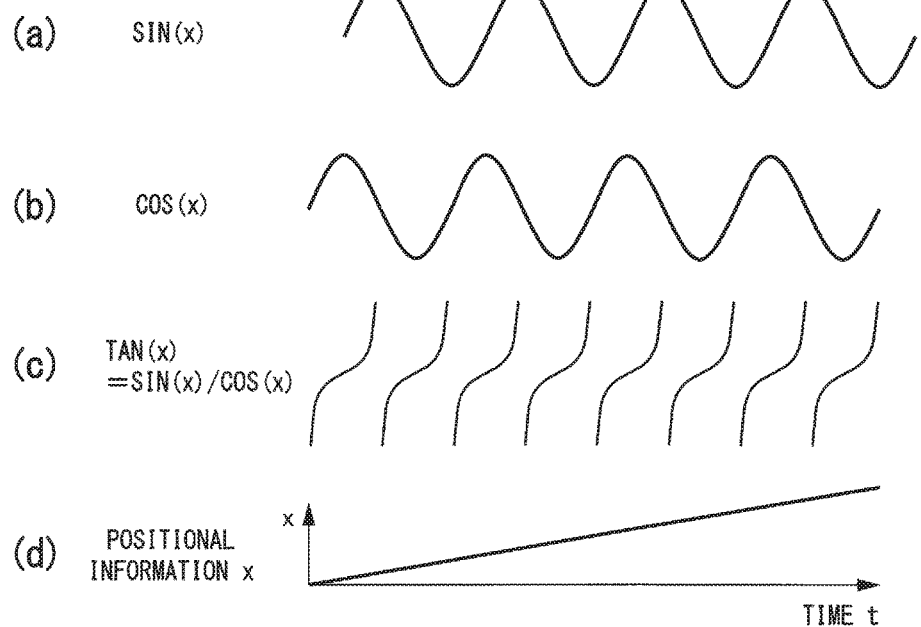
FIG. 24 is a waveform chart illustrating an example of the output signals according to the fourth embodiment of the present invention.

FIG. 24 illustrates an example of the waveform of each detection signal.

FIG. 24(a) illustrates the sinusoidal detection signal SIN (x) output by the subtractor 231. Although the SIN signal detected by the magnetic sensor 221 contains the SIN-DC signal that is a noise component with a period longer than one wavelength, the signal SIN(x) with the noise component removed is obtained by the subtractor 231.

FIG. 24(b) illustrates the cosine detection signal COS(x) output by the subtractor 232. Although the COS signal detected by the magnetic sensor 223 contains the COS-DC signal that is a noise component with a period longer than one wavelength, the signal COS (x) with the noise component removed is obtained by the subtractor 232.

In the position calculation section 233, as illustrated in FIG. 24(c) the calculation of TAN(x)=[detection signal SIN(x)/detection signal COS (x)] is performed to detect the signal TAN(x). The positional information x is calculated from the signal TAN(x), as illustrated in FIG. 24(d).

The information about the relative position between the magnetic head 220 and the magnetic scale 210 calculated in this manner becomes the accurate positional information based on a detection signal with less noise. That is, in the position detecting device of the example, a noise with a period longer than the period of one wavelength and/or a noise without periodicity are detected by the magnetic sensors 222, 224, and the noises contained in the signals detected by the magnetic sensors 221, 223 are removed using the noises detected by the respective magnetic sensors 222, 224. Accordingly, the sinusoidal detection signal SIN (x) and cosine detection signal COS(x) supplied to the position calculation section 233 do not have the distortion caused by longer-wavelength noise components, thus improving the position detection accuracy.

The effect of removing the noise is particularly significant when the clearance between each of the magnetic sensors 221, 222, 223, and 224 and the magnetic scale 210 is large. That is, when the clearance is large, the attenuation of the signal waveform recorded in the magnetic scale 210 is larger than the attenuation of the noise component that appears at a period longer than the wavelength of the signal recorded in the magnetic scale 210. Here, noise removal is performed using the configuration of the example, so that detection accuracy can be improved even when the clearance between each of the magnetic sensors 221, 222, 223, and 224 and the magnetic scale 210 is large.

4-3. Variant of Fourth Embodiment

Example with Sensor for Harmonic Removal

Next, a variant of the fourth embodiment is described.

Each of the magnetic sensor 221 that detects the SIN signal and the magnetic sensor 223 that detects the COS signal, which are included in the magnetic head 20 illustrated in FIG. 21 and FIG. 22, includes one sensor. In contrast, each of the magnetic sensors 221, 223 that detect the respective signals may include a plurality of sensors, so that the sinusoidal and cosine harmonics are removed by arithmetic processing of the signals of the plurality of sensors.

Figure 25:
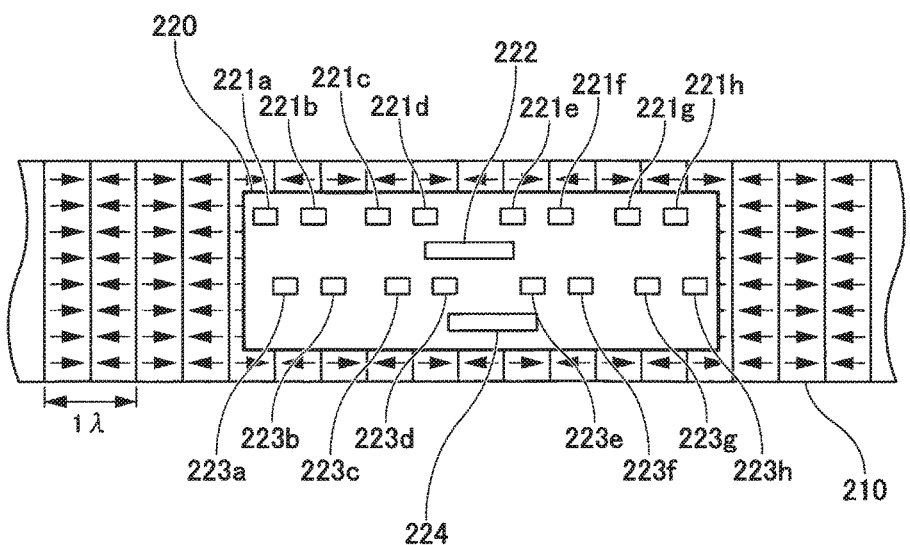
FIG. 25 is a plan view illustrating an example of the head configuration (an example provided with sensors for removing harmonics) of a variant of the fourth embodiment according to the present invention.

FIG. 25 illustrates an example in which eight magnetic sensors 221a to 221h are arranged in order to remove the harmonics of the SIN signal and eight magnetic sensors 223a to 223h are arranged in order to remove the harmonics of the COS signal.

For example, the eight magnetic sensors 221a to 221h that detect the SIN signal are divided into a first group of magnetic sensors 221a to 221d and a second group of magnetic sensors 221e to 221h, and four magnetic sensors of the respective groups are connected in a bridge to cancel the even-order distortions. Moreover, two groups of magnetic sensors are arranged at an interval for an increase change and decrease change in resistance to have mutually opposite phases between two groups. Then, the signals obtained by two groups of magnetic sensors connected in a bridge are summed by a differential amplifier to cancel the odd-order (such as the 3rd order) harmonic distortions.

The eight magnetic sensors 223a to 223h that detect the COS signal are divided into a first group of magnetic sensors 223a to 223d and a second group of magnetic sensors 223e to 223h, four magnetic sensors of the respective groups are connected in a bridge, and the signals obtained by two groups of magnetic sensors connected in a bridge are summed by a differential amplifier. In this manner, also in the COS signal, the even-order distortions and odd-order distortions are canceled.

Then, adjacent to the eight magnetic sensors 221a to 221h that detect the SIN signal, the magnetic sensor 222 with the length of one wavelength is arranged to detect the SIN-DC signal.

Moreover, adjacent to the eight magnetic sensors 223a to 223h that detect the COS signal, the magnetic sensor 224 with the length of one wavelength is arranged to detect the COS-DC signal.

Then, the SIN-DC signal obtained by the magnetic sensor 222 is subtracted from the SIN signal obtained from the eight magnetic sensors 221a to 221h by the subtractor 231 illustrated in FIG. 23 to give the sinusoidal detection signal SIN(x). Similarly, the COS-DC signal obtained by the magnetic sensor 224 is subtracted from the COS signal obtained from the eight magnetic sensors 223a to 223h by the subtractor 232 illustrated in FIG. 23 to give the cosine detection signal COS(x). The subsequent procedure is the same as the procedure described in FIG. 23.

As illustrated in FIG. 25, due to the sensor array that removes harmonic distortions, the signals used in performing position detection will not have harmonic distortions, and the noise with a period longer than the period of one wavelength and the noise without periodicity are removed, and in addition the detection accuracy will be further improved. Note that, the number and array of the sensors, which remove harmonic distortions, illustrated in FIG. 25 are just an example, and thus other numbers and arrays of the sensors may be applicable.

4-4. Variant of Fourth Embodiment

Example with a Plurality of Sub-Sensors

In the magnetic head described above, an example has been illustrated in which one magnetic sensor 222 or 224 for noise component detection is arranged adjacent to one magnetic sensor or one set of magnetic sensors. In contrast, one sensor for noise component detection may be arranged on both adjacent sides of one magnetic sensor or one set of magnetic sensors, i.e., a total of two sensors for noise component detection may be arranged.

Figure 26:
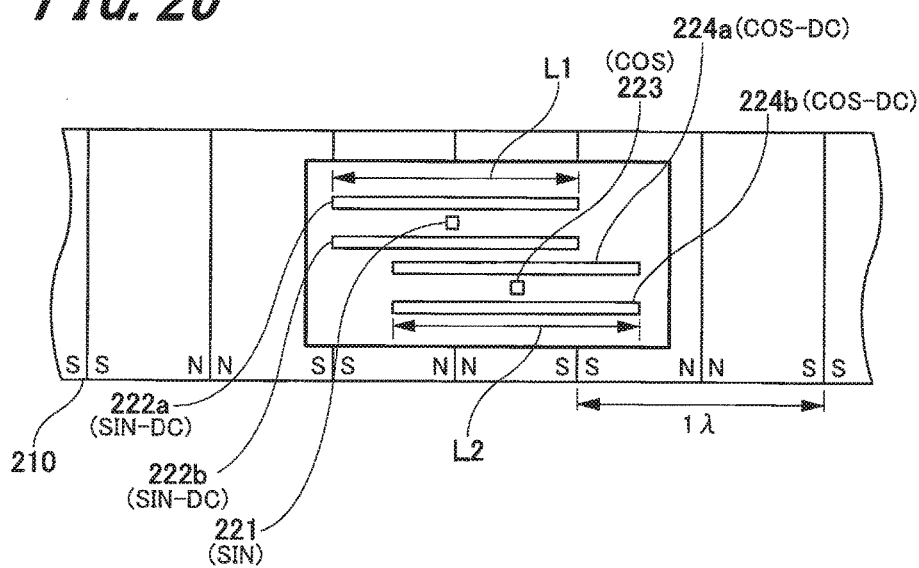
FIG. 26 is a plan view illustrating an example of the head configuration (an example provided with a plurality of sub-sensors) of a variant of the fourth embodiment according to the present invention.

That is, for example, as illustrated in FIG. 26, the magnetic sensor 221 that detects the SIN signal and the magnetic sensor 223 that detects the COS signal are arranged in the magnetic head 220. Then, on one of adjacent sides of the magnetic sensor 221 that detects the SIN signal, a magnetic sensor 222a with the length of one wavelength L1 of the recording signal is arranged, while on the other one of adjacent sides of the magnetic sensor 221, a magnetic sensor 222b with the length of one wavelength L2 of the recording signal is arranged.

Furthermore, on one of adjacent sides of the magnetic sensor 223 that detects the COS signal, a magnetic sensor 224a with the length of one wavelength L2 of the recording signal is arranged, while on the other one of adjacent sides of the magnetic sensor 223, a magnetic sensor 224b with the length of one wavelength L2 of the recording signal is arranged.

Figure 27:
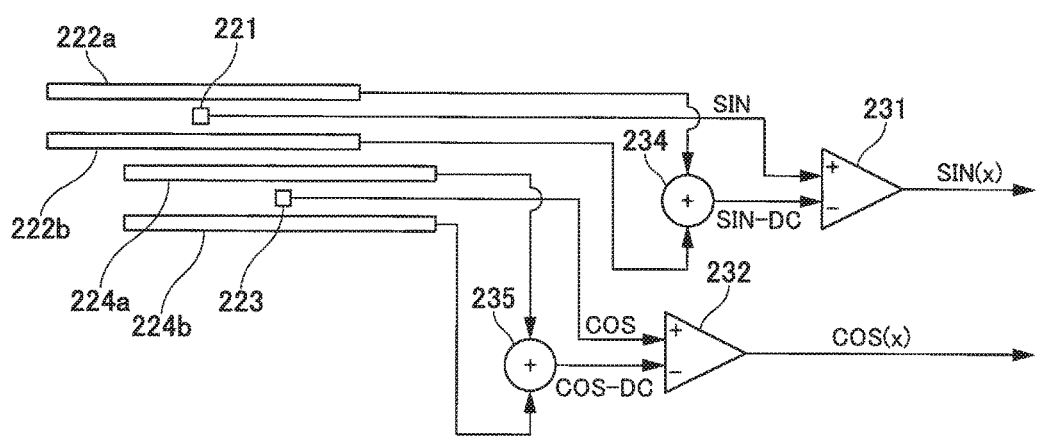
FIG. 27 is a block diagram illustrating an example of processing the output signal of each sensor of the example of FIG. 26.

FIG. 27 illustrates a circuit configuration for processing the detection signals of the magnetic head 220 of the example of FIG. 26.

Two detection signals of the magnetic sensors 222a and 222b with the length of one wavelength are summed by an adder 234. The signal summed by the adder 234 serves as the SIN-DC signal. Then, a difference between the SIN-DC signal that is the noise component obtained by the adder 234 and the SIN signal obtained by the magnetic sensor 221 is obtained by the subtractor 231 to give the sinusoidal signal SIN(x).

Similarly, two detection signals of the magnetic sensors 224a and 224b with the length of one wavelength are summed by an adder 235. The signal summed by the adder 235 serves as the COS-DC signal. Then, a difference between the COS-DC signal that is the noise component obtained by the adder 235 and the COS signal obtained by the magnetic sensor 223 is obtained by a subtractor 232 to give the sinusoidal signal COS(x).

The magnetic sensors that detect the noise component are arranged on both adjacent sides in the direction orthogonal to the longitudinal direction of the magnetic scale 210 in this manner, so that the noise components can be removed more effectively.

Note that, in the configurations of FIG. 26 and FIG. 27, an example is illustrated in which one magnetic sensor 221 that detects the SIN signal and one magnetic sensor 223 that detects the COS signal are arranged, respectively. In contrast, as illustrated in FIG. 25, also in the case of the configuration of sensors for removing harmonic distortions, the magnetic sensor that detects the noise component may be similarly arranged on both adjacent sides of the respective groups of magnetic sensors.

4-5. Variant of Fourth Embodiment

Example of Optical Scale

Figure 28:
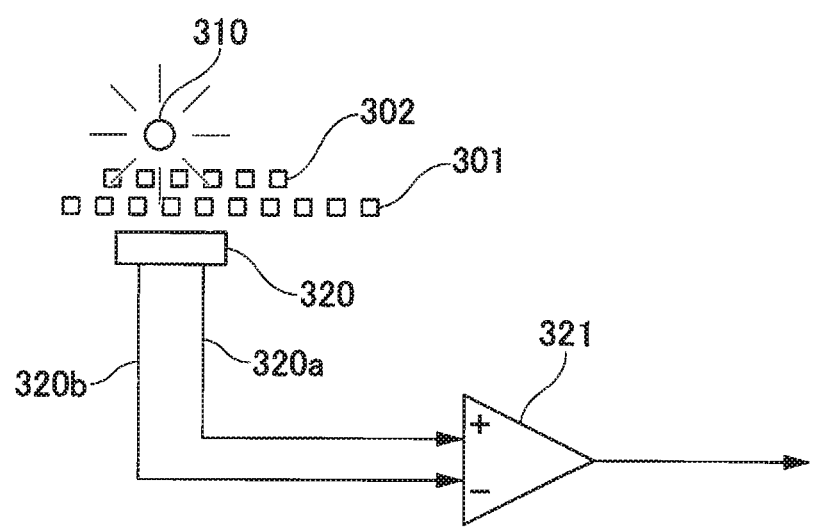
FIG. 28 is a fundamental view illustrating the configuration (an example of the optical scale) of a variant of the fourth embodiment according to the fourth embodiment of the present invention.

FIG. 28 illustrates an example in which the fourth embodiment is applied to an optical scale.

In the optical scale illustrated in FIG. 28, a main scale 301 and a sub-scale 302 each having the grids of a constant pitch formed therein are prepared, and then the respective scales 301, 302 are overlapped with each other with a certain angle. Then, the light from a light source 310 is caused to transmit through the main scale 301 and sub-scale 302, and then the transmitted light is received by an optical head 320. Here, because the optical head 320 moves in a direction, along which the grids are arranged, of the main scale 301, a waveform corresponding to the arrangement state of the grids is detected from a change in the light receiving state in the optical head 320 and thus a travel position of the optical head 320 is detected.

Here, the optical head 320 includes a main sensor having a relatively narrow light receiving range and a sub-sensor having a wide light receiving range. The sub-sensor is a sensor having a wide light receiving range that receives the signal with the width of one pitch (or width of an integral multiple of one pitch) of the grids arranged in the main scale 301. Accordingly, the signal, which the main sensor receives light and outputs, becomes a signal whose level varies with the position of a grid stripe. On the other hand, the signal, which the sub-sensor receives light and outputs, becomes a signal that is not affected by the position of a grid stripe.

Then, an output 320a of the main sensor and an output 320b of the sub-sensor, in the optical head 320, are supplied to a subtractor 321, and then a difference between the outputs of the both sensors is obtained by the subtractor 321. The output of the subtractor 321 serves as a detection signal for position detection.

With such an arrangement, the noise components contained in the signal received by the optical head 320 can be removed, thus allowing for excellent position detection.

4-6. Other Variants of Fourth Embodiment

Note that, the values, such as 400 µm indicated as the value of one wavelength and 250 µm indicated as the numerical value of the clearance described in the above-described embodiments, indicate just one preferable example, and the present invention is not limited to these numerical values. Moreover, in the position detecting device of the example, the capability of increasing the clearance as compared with the conventional one has been described as one of the effects, but of course, the present invention may be applied to a position detecting device having a narrower clearance between the scale and the head. When the clearance is narrower, the amplitude of the detection signal of the sensor can be secured accordingly, and an improvement in detection accuracy can be achieved accordingly.

Moreover, in the above-described embodiment, the lengths of the magnetic sensors 22, 24 that are the sub-sensors to detect the noise components are set to the length of one wavelength of the signal recorded in the magnetic scale 10. In contrast, the lengths of the magnetic sensors 22, 24 may be set to the length of an integral multiple of one wavelength of the signal recorded in the magnetic scale 10. Even when the sensors have the length of an integral multiple of one wavelength, the sensitivity to the wavelength of the signal recorded in the magnetic scale 10 can be set to zero, and thus the same effect can be obtained as the case where the magnetic sensors 22, 24 having the length of one wavelength is used.

Moreover, in the example illustrated in FIG. 21 to FIG. 23, there is shown a configuration in which the position detection is performed using the sinusoidal SIN signal and the cosine COS signal. In contrast, magnetic sensors that obtain the −SIN signal and −COS signal having the phases opposite to the respective SIN signal and COS signal may be arranged so as to use the −SIN signal and the −COS signal in performing the position detection. Also in this case, adjacent to the magnetic sensors that obtain the −SIN signal and −COS signal, magnetic sensors with the length of one wavelength (or an integral multiple thereof) may be arranged to perform the noise removal with respect to the respective signals.

Moreover, the configuration for processing the detection signal of each sensor illustrated in FIG. 23 or FIG. 27 is also just one preferable example, and the present invention is not limited to the configuration described FIG. 23 or FIG. 27. For example, in the example illustrated in FIG. 23, the output signals of the magnetic sensors 221, 223 that are the main sensors and the output signals of the magnetic sensors 222, 224 that are the sub-sensors are supplied to the subtractors 231 and 232, and then the differences between the relevant output signals are calculated by the subtractors 231 and 232, respectively. In contrast, a position detection procedure may be performed which include the steps of obtaining two detection signals, i.e., the output signal of the main sensor and the output signal of the sub-sensor; and performing other arithmetic processing using these two detection signals to exclude the influence of noise components.

Moreover, in the configuration illustrated in FIG. 23 or FIG. 27, only the configuration is illustrated for performing calculation with a subtractor or an adder, but for example, before performing the calculations, such as these subtraction and summation, subtraction or summation may be performed after adjusting the amplitude (gain) of the detection signals of the respective sensors.

Variant Common to Each Embodiment

Note that the configurations described in the first to fourth embodiments may be combined into and applied to one position detecting device.

Moreover, the respective values, such as one wavelength and one pitch described in each embodiment, are just a preferable example, and the present invention is not limited to these numerical values. For example, 400 µm is indicated as one wavelength, but an appropriate value can be selected within a range from approximately several tens of µm to several hundreds of µm depending on the positioning resolution needed as the position detecting device.

With regard to the size of an individual magnetism detecting element, the length of one side set to approximately 2 µm to 10 µm is just one example, and a magnetism detecting element with a size larger or smaller than 2 µm to 10 µm may be used.

Moreover, the arrangement examples of the magnetism detecting elements illustrated in FIG. 7, FIG. 11, FIG. 12, FIG. 14, and the like are just one preferable example, and the magnetism detecting elements may be arranged in an arrangement different from these examples.

Moreover, the orders of the harmonic distortions to reduce (remove) are just one preferable example, and higher order (15th or more order) harmonic distortions may be removed.

Moreover, in the example of each embodiment, as the magnetism detecting element, a TMR element using a tunnel magneto-resistance effect is used, but an element having other configuration may be used.

Moreover, the configuration, in which two bias magnetic field generation sections 31 and 32 are arranged so as to sandwich the magnetism detecting element 21 as illustrated in FIG. 15, is just one preferable example. The present invention is not limited to such an arrangement position.

Moreover, in the example of each embodiment, an example is described in which a scale is applied to a linear position detecting device. In contrast, by arranging the magnetic scale in a circle, the present invention may be applied to a position detecting device that detects a relative rotation angle between a scale and a head. The configuration of FIG. 6 in which a scale is illustrated as an example of the linear position detecting device is also just one example, and the present invention can be applied to position detecting devices for other various apparatuses.

It should be understood by those skilled in the art that various modifications, combinations, sub-combinations and alterations may occur depending on design requirements and other factors insofar as they are within the scope of the appended claims or the equivalents thereof.

BRIEF DESCRIPTION OF THE REFERENCE SYMBOLS

1 . . . magnetic scale,
2 . . . detecting section, 3a to 3h . . . magnetism detecting element,
4 . . . operational amplifier,
5 . . . magnetic head,
5a, 5b . . . magnetic sensor
11 . . . magnetic scale,
11N . . . N pole magnetization section,
11S . . . S pole magnetization section,
20 . . . detecting section,
20-1 . . . −COS detecting section,
20-2 . . . COS detecting section,
20-3 . . . −SIN detecting section,
20-4 . . . SIN detecting section,
20-1a to 20-1j, 20-2a to 20-2j, 20-3a to 20-3j, 20-4a to 20-4j . . . compact arrangement section,
21 . . . magnetism detecting element,
21a . . . fixed layer,
21b . . . barrier layer,
21c . . . free layer
22, 23 . . . operational amplifier,
31, 32 . . . bias magnetic field generation section
100 . . . apparatus,
101 . . . stationary section,
102 . . . movable stage,
103 . . . work piece,
104 . . . position detecting section,
105 . . . machining tool,
106 . . . drive section,
107 . . . control section,
108 . . . target position input section,
220 . . . magnetic head,
221, 221a to 221h, 222, 222a, 222b, 223, 223a to 223h, 224, 224a, 224b . . . magnetic sensor
231, 232 . . . subtractor,
233 . . . position calculation section,
234, 235 . . . adder,
301 . . . main scale,
302 . . . sub-scale,
310 . . . light source,
320 . . . optical head,
321 . . . subtractor

What is claimed is:

1. A position detecting device comprising:
a scale including a magnetic medium having a magnetic signal with a constant period magnetically recorded thereon;
a plurality of magnetism detecting elements each configured to
detect a leakage magnetism from the magnetic signal of the scale and
output a signal corresponding to the magnetic signal at a position where the leakage magnetism has been detected; and
a position detecting section configured to detect a position relative to the scale based on each output signal corresponding to the magnetic signal, wherein
the plurality of magnetism detecting elements are formed into a plurality of groups of magnetism detecting elements, from which are output at least one set of signals, having different phases from each other, the plurality of groups of magnetism detecting elements being arranged at positions each being shifted relative to each other by ¼ of one unit wavelength of the magnetic signal along the detection direction,
each group of magnetism detecting element comprising plural magnetism detecting elements,
magnetism detecting elements of each of the plurality of groups being arranged along a detection direction of the magnetic signal relative to the scale with respect to other magnetism detecting elements within the same group, and
the groups of magnetism detecting elements being spaced from each other in a direction orthogonal to the detection direction within a range shorter than one unit wavelength of the magnetic signal.

2. The position detecting device according to claim 1, wherein the groups of magnetism detecting elements include a first group from which a SIN waveform is output, a second group from which a COS waveform is output, a third group from which a −SIN waveform is output, and a fourth group from which a −COS waveform is output, and wherein
the first, second, third, and fourth groups are arranged at positions each being shifted relative to each other by ¼ of one unit wavelength of the magnetic signal along the detection direction,
the groups whose output waveforms have phases that are opposite to each other, are arranged adjacent to each other in a direction orthogonal to the detection direction, and
the magnetism detecting elements of each of the plurality of groups of magnetism detecting elements are arranged within a range of one unit wavelength of the magnetic signal.

3. The position detecting device according to claim 2, wherein the elements of each of the first, second, third, and fourth groups are arranged in the same configuration, and an arrangement of each group in a longitudinal direction is shifted in the longitudinal direction with respect to another group by a distance within a range shorter than one unit wavelength of the magnetic signal.

4. The position detecting device according to claim 2, wherein the magnetic signal is output from a bridge circuit of one of the groups including a first element group connected in series with a power-supply voltage and a second element group connected in series with a ground.

* * * * *